United States Patent
Lee et al.

(10) Patent No.: US 12,550,783 B2
(45) Date of Patent: Feb. 10, 2026

(54) DEVICE AND METHOD FOR UBM/RDL ROUTING

(71) Applicant: Taiwan Semiconductor Manufacturing Company, Ltd., Hsin-Chu (TW)

(72) Inventors: Meng-Tsan Lee, Hsin-Chu (TW); Wei-Cheng Wu, Hsin-Chu (TW); Tsung-Shu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 92 days.

(21) Appl. No.: 15/157,312

(22) Filed: May 17, 2016

(65) Prior Publication Data

US 2017/0338204 A1 Nov. 23, 2017

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/565* (2013.01); *H01L 21/78* (2013.01); *H01L 23/3121* (2013.01); *H01L 23/481* (2013.01); *H01L 23/49811* (2013.01); *H01L 23/5389* (2013.01); *H01L 24/03* (2013.01);
(Continued)

(58) Field of Classification Search
CPC ............. H01L 25/0657; H01L 23/3121; H01L 23/481; H01L 23/49811; H01L 23/5389; H01L 24/03; H01L 24/11; H01L 24/13; H01L 24/19; H01L 24/20; H01L 25/105; H01L 25/50; H01L 24/29; H01L 24/32; H01L 24/48; H01L 24/73; H01L 24/92; H01L 23/488; H01L 24/02
See application file for complete search history.

(56) References Cited

U.S. PATENT DOCUMENTS 6,958,537 B2* 10/2005 Eng ..................... H01L 21/4857
257/E21.705
7,901,956 B2* 3/2011 Kuan ....................... H01L 22/34
257/E23.021
(Continued)

FOREIGN PATENT DOCUMENTS

CN 104795371 A 7/2015
CN 105321912 A 2/2016

*Primary Examiner* — Jarrett J Stark
(74) *Attorney, Agent, or Firm* — Slater Matsil, LLP

(57) ABSTRACT

An under bump metallurgy (UBM) and redistribution layer (RDL) routing structure includes an RDL formed over a die. The RDL comprises a first conductive portion and a second conductive portion. The first conductive portion and the second conductive portion are at a same level in the RDL. The first conductive portion of the RDL is separated from the second conductive portion of the RDL by insulating material of the RDL. A UBM layer is formed over the RDL. The UBM layer includes a conductive UBM trace and a conductive UBM pad. The UBM trace electrically couples the first conductive portion of the RDL to the second conductive portion of the RDL. The UBM pad is electrically coupled to the second conductive portion of the RDL. A conductive connector is formed over and electrically coupled to the UBM pad.

20 Claims, 21 Drawing Sheets

(51) Int. Cl.
  *H01L 21/78*     (2006.01)
  *H01L 23/00*     (2006.01)
  *H01L 23/31*     (2006.01)
  *H01L 23/48*     (2006.01)
  *H01L 23/498*    (2006.01)
  *H01L 23/538*    (2006.01)
  *H01L 25/00*     (2006.01)
  *H01L 25/10*     (2006.01)

(52) U.S. Cl.
  CPC .............. *H01L 24/11* (2013.01); *H01L 24/13* (2013.01); *H01L 24/19* (2013.01); *H01L 24/20* (2013.01); *H01L 25/105* (2013.01); *H01L 25/50* (2013.01); *H01L 24/29* (2013.01); *H01L 24/32* (2013.01); *H01L 24/48* (2013.01); *H01L 24/73* (2013.01); *H01L 24/92* (2013.01); *H01L 2224/0231* (2013.01); *H01L 2224/0237* (2013.01); *H01L 2224/0401* (2013.01); *H01L 2224/04105* (2013.01); *H01L 2224/05024* (2013.01); *H01L 2224/12105* (2013.01); *H01L 2224/13022* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13609* (2013.01); *H01L 2224/13611* (2013.01); *H01L 2224/13616* (2013.01); *H01L 2224/13639* (2013.01); *H01L 2224/13644* (2013.01); *H01L 2224/13655* (2013.01); *H01L 2224/13664* (2013.01); *H01L 2224/16235* (2013.01); *H01L 2224/2919* (2013.01); *H01L 2224/32145* (2013.01); *H01L 2224/32225* (2013.01); *H01L 2224/48091* (2013.01); *H01L 2224/48106* (2013.01); *H01L 2224/48145* (2013.01); *H01L 2224/48227* (2013.01); *H01L 2224/73253* (2013.01); *H01L 2224/73257* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06517* (2013.01); *H01L 2225/06548* (2013.01); *H01L 2225/06568* (2013.01); *H01L 2225/06572* (2013.01); *H01L 2225/1035* (2013.01); *H01L 2225/1058* (2013.01); *H01L 2924/01013* (2013.01); *H01L 2924/01022* (2013.01); *H01L 2924/01029* (2013.01); *H01L 2924/01074* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10331* (2013.01); *H01L 2924/10332* (2013.01); *H01L 2924/10333* (2013.01); *H01L 2924/10335* (2013.01); *H01L 2924/10336* (2013.01); *H01L 2924/10337* (2013.01); *H01L 2924/10338* (2013.01); *H01L 2924/10339* (2013.01); *H01L 2924/10342* (2013.01); *H01L 2924/10351* (2013.01); *H01L 2924/14* (2013.01); *H01L 2924/1421* (2013.01); *H01L 2924/1431* (2013.01); *H01L 2924/1432* (2013.01); *H01L 2924/14335* (2013.01); *H01L 2924/1436* (2013.01); *H01L 2924/1437* (2013.01); *H01L 2924/1461* (2013.01); *H01L 2924/15311* (2013.01)

(56) References Cited

U.S. PATENT DOCUMENTS

| | | | |
|---|---|---|---|
| 7,977,783 B1* | 7/2011 | Park | H01L 24/11 257/692 |
| 8,097,490 B1* | 1/2012 | Pagaila | H01L 24/97 438/106 |
| 8,106,516 B1* | 1/2012 | Lacap | B23K 35/0222 257/666 |
| 8,823,180 B2 | 9/2014 | Wang et al. | |
| 8,937,381 B1 | 1/2015 | Dunlap et al. | |
| 9,006,030 B1* | 4/2015 | Kwon | H01L 23/562 438/108 |
| 9,087,832 B2 | 7/2015 | Huang et al. | |
| 9,263,373 B2* | 2/2016 | Hu | H01L 21/4825 |
| 9,263,511 B2* | 2/2016 | Yu | H01L 28/60 |
| 9,449,953 B1* | 9/2016 | Shih | H01L 25/50 |
| 9,472,522 B2* | 10/2016 | Chen | H01L 23/562 |
| 9,559,081 B1* | 1/2017 | Lai | H01L 25/0657 |
| 9,589,900 B2 | 3/2017 | Su et al. | |
| 9,633,974 B2* | 4/2017 | Zhai | H01L 25/0652 |
| 9,640,496 B2* | 5/2017 | Chen | H01L 24/05 |
| 9,679,801 B2 | 6/2017 | Lai et al. | |
| 9,728,498 B2* | 8/2017 | Su | H01L 25/105 |
| 9,786,623 B2* | 10/2017 | Lin | H01L 24/17 |
| 9,786,632 B2* | 10/2017 | Lin | H01L 25/50 |
| 9,799,620 B2 | 10/2017 | Huang et al. | |
| 9,824,989 B2 | 11/2017 | Shih et al. | |
| 9,825,003 B2* | 11/2017 | Oh | H01L 25/0655 |
| 9,875,973 B2* | 1/2018 | Lin | H01L 23/562 |
| 9,941,195 B2* | 4/2018 | Liao | H01L 23/49822 |
| 2003/0153173 A1* | 8/2003 | Chuang | H01L 23/5258 438/613 |
| 2004/0040855 A1* | 3/2004 | Batinovich | H01L 21/2885 205/123 |
| 2004/0165362 A1 | 8/2004 | Farnworth | |
| 2005/0189612 A1* | 9/2005 | Hung | H01L 21/76807 257/529 |
| 2006/0226542 A1* | 10/2006 | Chien | H01L 23/3114 257/737 |
| 2006/0246706 A1* | 11/2006 | Ke | H01L 24/11 438/613 |
| 2006/0252225 A1 | 11/2006 | Gambee et al. | |
| 2007/0182004 A1 | 8/2007 | Rinne | |
| 2007/0184643 A1* | 8/2007 | Rinne | H01L 21/0272 438/612 |
| 2008/0054461 A1 | 3/2008 | Lang et al. | |
| 2008/0293232 A1 | 11/2008 | Kang et al. | |
| 2009/0140441 A1 | 6/2009 | Camacho et al. | |
| 2009/0140442 A1* | 6/2009 | Lin | H01L 21/565 257/778 |
| 2009/0152715 A1 | 6/2009 | Shim et al. | |
| 2009/0212428 A1* | 8/2009 | Yang | H01L 23/525 257/738 |
| 2009/0224391 A1* | 9/2009 | Lin | H01L 21/6835 257/690 |
| 2009/0224402 A1 | 9/2009 | Do et al. | |
| 2009/0294899 A1* | 12/2009 | Pagaila | H01L 21/6835 257/528 |
| 2010/0133704 A1* | 6/2010 | Marimuthu | H01L 21/565 257/778 |
| 2010/0244280 A1 | 9/2010 | Shimizu et al. | |
| 2011/0068459 A1* | 3/2011 | Pagaila | H01L 24/97 257/698 |
| 2011/0204505 A1* | 8/2011 | Pagaila | H01L 23/5389 257/686 |
| 2011/0221054 A1* | 9/2011 | Lin | H01L 24/20 257/692 |
| 2012/0018876 A1 | 1/2012 | Wu et al. | |
| 2012/0018882 A1 | 1/2012 | Shim et al. | |
| 2012/0038053 A1 | 2/2012 | Oh et al. | |
| 2012/0273960 A1* | 11/2012 | Park | H01L 23/49827 257/774 |
| 2013/0026618 A1* | 1/2013 | Chen | H01L 23/3192 257/737 |

(56) References Cited

U.S. PATENT DOCUMENTS

| | | | |
|---|---|---|---|
| 2013/0075936 A1* | 3/2013 | Lin | H01L 23/49816 257/777 |
| 2013/0093078 A1* | 4/2013 | Lin | H01L 21/568 257/737 |
| 2013/0093097 A1* | 4/2013 | Yu | H01L 24/81 257/774 |
| 2013/0249106 A1* | 9/2013 | Lin | H01L 23/49894 257/774 |
| 2013/0307140 A1* | 11/2013 | Huang | H01L 23/49811 257/737 |
| 2014/0097532 A1 | 4/2014 | Chiang et al. | |
| 2014/0175663 A1* | 6/2014 | Chen | H01L 21/768 257/774 |
| 2014/0183731 A1 | 7/2014 | Lin et al. | |
| 2014/0210080 A1* | 7/2014 | Chang | H01L 24/19 257/738 |
| 2014/0252647 A1* | 9/2014 | Huang | H01L 23/49827 257/774 |
| 2015/0041987 A1 | 2/2015 | Yew et al. | |
| 2015/0069623 A1* | 3/2015 | Tsai | H01L 25/117 257/774 |
| 2015/0179591 A1* | 6/2015 | Tsai | H01L 21/486 257/774 |
| 2015/0187743 A1* | 7/2015 | Yu | H01L 24/19 257/741 |
| 2015/0270232 A1* | 9/2015 | Chen | H01L 23/3107 257/691 |
| 2015/0270247 A1* | 9/2015 | Chen | H01L 23/4857 257/738 |
| 2015/0303158 A1* | 10/2015 | Huang | H01L 23/49827 438/126 |
| 2016/0056126 A1* | 2/2016 | Yu | H01L 23/3135 257/737 |
| 2016/0071816 A1* | 3/2016 | Huang | H01L 25/0655 257/738 |
| 2016/0133614 A1* | 5/2016 | Gu | H01L 23/49827 257/773 |
| 2016/0133686 A1 | 5/2016 | Liao et al. | |
| 2016/0163564 A1* | 6/2016 | Yu | H01L 24/92 257/774 |
| 2016/0260684 A1* | 9/2016 | Zhai | H01L 25/0652 |
| 2016/0276237 A1* | 9/2016 | Lin | H01L 23/49816 |
| 2016/0284642 A1* | 9/2016 | Ganesan | H01L 23/5226 |
| 2016/0300813 A1* | 10/2016 | Zhai | H01L 21/561 |
| 2016/0322238 A1* | 11/2016 | Chen | H01L 21/565 |
| 2016/0322332 A1 | 11/2016 | Kim et al. | |
| 2016/0343694 A1* | 11/2016 | Lin | H01L 21/78 |
| 2016/0358889 A1* | 12/2016 | Lai | H01L 21/768 |
| 2017/0084556 A1 | 3/2017 | Chen et al. | |
| 2017/0125346 A1* | 5/2017 | Liu | H01L 23/5384 |
| 2018/0337122 A1 | 11/2018 | Liao et al. | |

* cited by examiner

DEVICE AND METHOD FOR UBM/RDL ROUTING

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
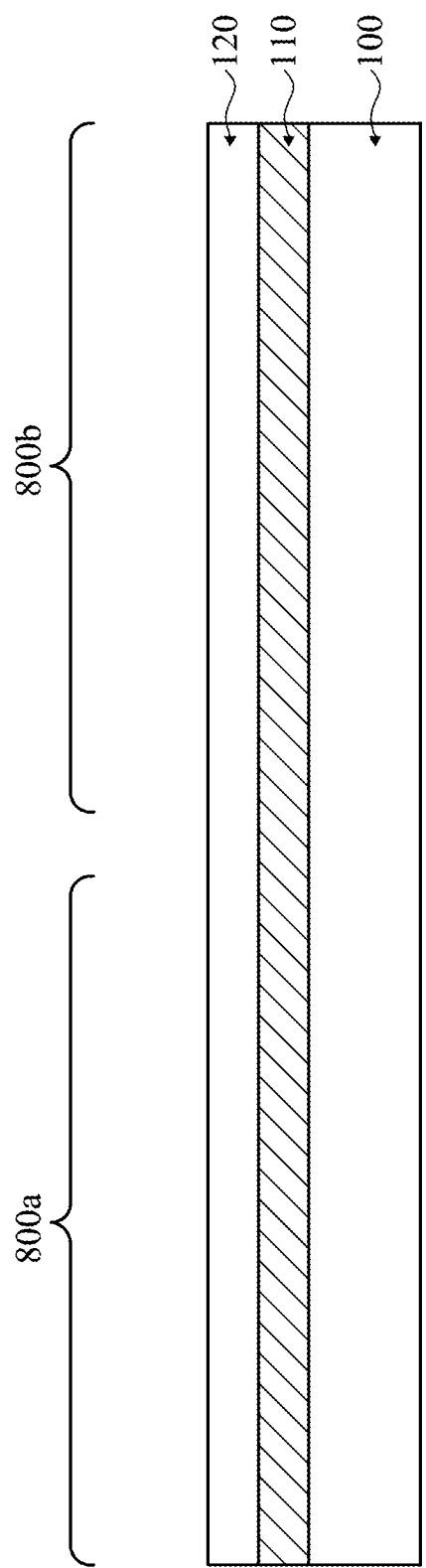
FIGS. 1 through 15 illustrate cross-sectional views of intermediate steps during a process to form a first package structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to one or more other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein may be discussed in a specific context, namely electrical routing for under bump metallurgy (UBM) and redistribution layer (RDL) structures in a packaged device. Representative implementations of package structures may include, e.g., a fan-out package. Representatively disclosed embodiments herein are applicable to any package structure, including one or more integrated circuit dies. Other embodiments contemplate other applications, such as different package types and/or different configurations that would be readily apparent to a person of ordinary skill in the art upon reading this disclosure. It should be noted that embodiments discussed herein may not necessarily illustrate every component or feature that may be present in a particular structure. For example, various components may be omitted from a figure, such as when discussion of one or more other components may be sufficient to describe a particular embodiment.

UBM/RDL routing designs of representative embodiments improve reliability considerations relating to, e.g., electromigration, susceptibility to drop damage, and thermal cycling integrity. Accordingly, an improved UBM/RDL routing structure is desirable to provide robust and reliable device package structures.

FIGS. 1 through 15 illustrate cross-sectional views of intermediate steps during a process to form a first package structure in accordance with representative embodiments. FIG. 1 illustrates a carrier substrate 100 and a release layer 110 formed on the carrier substrate 100. A first package region 800a and a second package region 800b, for the formation of a first package and a second package, respectively, are illustrated.

Carrier substrate 100 may be a glass carrier substrate, a ceramic carrier substrate, or the like. Carrier substrate 100 may be a wafer; such that multiple packages can be formed on carrier substrate 100 substantially simultaneously. Release layer 110 may be formed of a polymer-based material, which may be removed along with carrier substrate 100 from overlying structures formed in subsequent steps. In some embodiments, release layer 110 may comprise an epoxy-based, thermal-release material, which loses adhesion when heated, such as a Light-to-Heat-Conversion (LTHC) release coating. In other embodiments, release layer 110 may comprise an ultra-violet (UV) glue, which loses adhesion when exposed to UV light. Release layer 110 may be dispensed as a liquid and cured, may be laminated as a film on carrier substrate 100, or the like. The top surface of release layer 110 may be leveled, or otherwise processed to provide acceptable planarity.

An insulating layer 120 is formed on release layer 110. The bottom surface of insulating layer 120 may be in contact with the top surface of release layer 110. In some embodiments, insulating layer 120 may be formed of a polymer, such as polybenzoxazole (PBO), polyimide, benzocyclobutene (BCB), or the like. In other embodiments, insulating layer 120 may be formed of a dielectric, a nitride (e.g., silicon nitride), an oxide (e.g., silicon oxide), a glass (e.g., phosphosilicate glass (PSG), borosilicate glass (BSG), boron-doped phosphosilicate glass (BPSG)), or the like.

Insulating layer 120 may be formed by any acceptable deposition process, such as spin coating, chemical vapor deposition (CVD), lamination, or the like, or a combination thereof.

Figure 2:
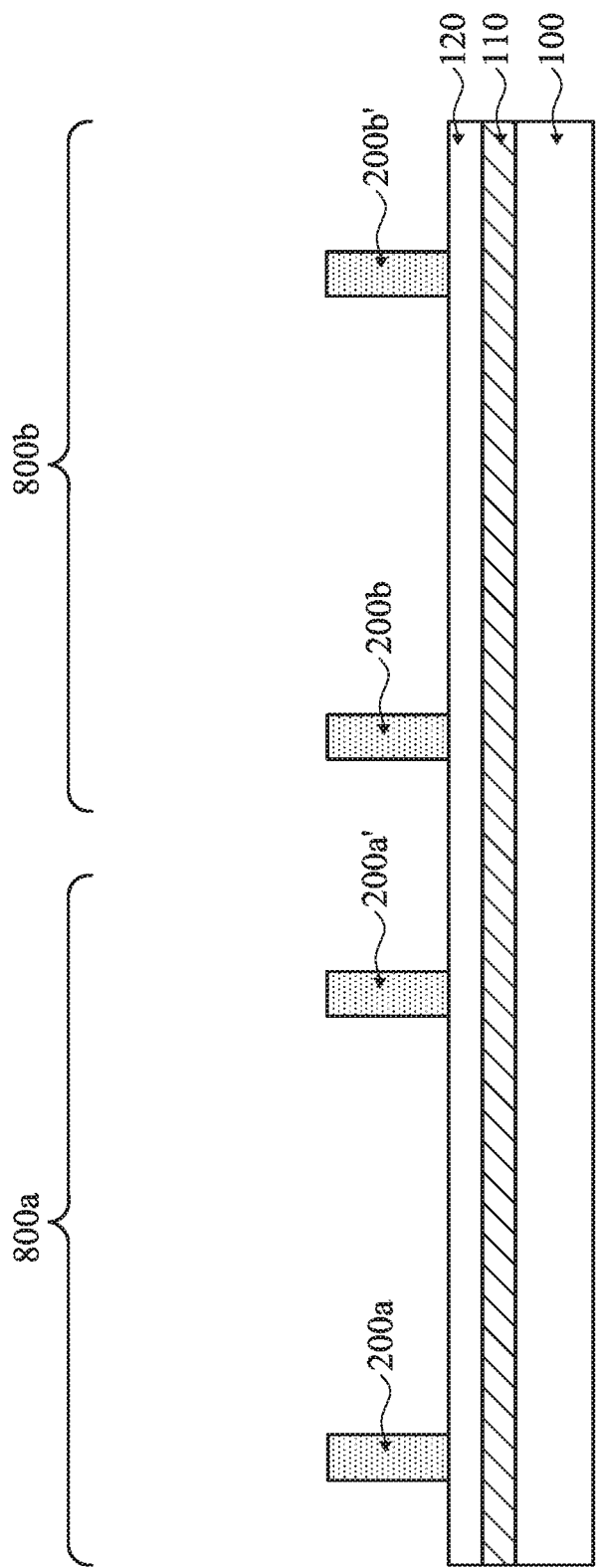

As representatively illustrated in FIG. 2, electrical connectors 200a, 200a', 200b, 200b' are formed over insulating layer 120. Electrical connectors 200a and 200a' are formed in first package region 800a. Electrical connectors 200b and 200b' are formed in second package region 800b. As a representative example to form electrical connectors 200a, 200a', 200b, 200b', a seed layer (not shown) is formed on insulating layer 120. In some embodiments, the seed layer comprises a metal layer, which may be a single layer or a composite layer having a plurality of sub-layers formed of different materials. In some embodiments, the seed layer comprises a titanium layer and a copper layer over the titanium layer. The seed layer may be formed using, e.g., PVD, or the like. Photoresist is formed and patterned on the seed layer. The photoresist may be formed by spin coating, or the like, and may be exposed to light for patterning. The pattern of the photoresist corresponds to subsequently formed electrical connectors 200a, 200a', 200b, 200b'. Patterning forms openings through the photoresist to expose the seed layer. A conductive material is formed in the openings of the photoresist and on exposed portions of the seed layer. The conductive material may be formed by plating, such as electroplating or electroless plating, or the like. The conductive material may comprise a metal, e.g., copper, titanium, tungsten, aluminum, or the like. The photoresist and portions of the seed layer on which the conductive material is not formed are removed. The photoresist may be removed by an acceptable ashing or stripping process, e.g., using an oxygen plasma, or the like. Once the photoresist is removed, exposed portions of the seed layer are removed, such as by using an acceptable etching process, e.g., wet or dry etching. Remaining portions of the seed layer and the conductive material form electrical connectors 200a, 200a', 200b, 200b'.

Figure 3:
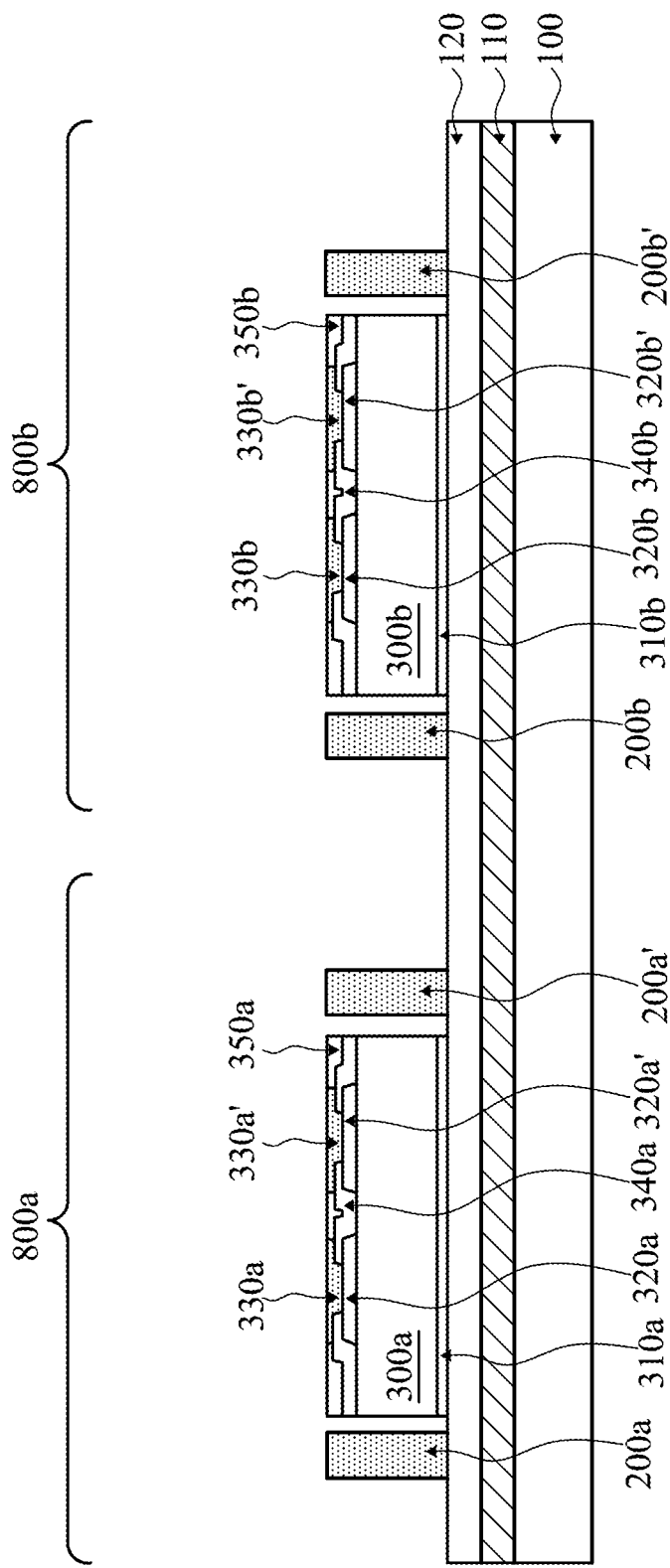

As representatively illustrated in FIG. 3, integrated circuit (IC) dies 300a, 300b are adhered to insulating layer 120 by an adhesive 310a, 310b, respectively. IC dies 300a, 300b are adhered in respective first package region 800a and second package region 800b. In other embodiments, more or fewer IC dies may be adhered in each region. IC dies 300a, 300b may comprise logic dies (e.g., central processing unit, microcontrollers, etc.), memory dies (e.g., dynamic random access memories (DRAM), static random access memories (SRAM), etc.), power management dies (e.g., power management integrated circuits (PMIC)), radio frequency (RF) dies, sensor dies, micro-electro-mechanical-system (MEMS) dies, signal processing dies (e.g., digital signal processors (DSP)), front-end dies (e.g., analog front-end (AFE) dies), or the like, or a combination thereof. In representative embodiments, IC dies 300a, 300b may be different sizes. In other embodiments, IC dies 300a, 300b may be substantially the same size.

As provided, IC die 300a may comprise overlying electrical contact features 320a, 320a' (e.g., one or more contact pads), metallization features 330a, 330a' (e.g., one or more metallization layers), passivation features 340a (e.g., one or more passivation layers), insulating features 350a (e.g., one or more dielectric layers), or the like, or combinations thereof. As provided, IC die 300b may comprise overlying electrical contact features 320b, 320b', metallization features 330b, 330b', passivation features 340b, insulating features 350b, or the like, or combinations thereof. In representative embodiments, a plurality of metallization features and insulating features of IC dies 300a, 300b may comprise one or more RDLs.

Electrical contact features 320a, 320a', 320b, 320b' may comprise pads, such as aluminum pads, to which external connections may be made. The pads may be disposed on what may be referred to as respective active sides of IC dies 300a, 300b. Passivation features 340a, 340b may comprise passivation films on IC dies 300a, 300b and on portions of the pads. Openings may be formed through the passivation films to the pads. Metallization features 330a, 330a', 330b, 330b' may comprise die connectors, such as conductive pillars (e.g., comprising a metal such as copper), in the openings through the passivation films, and may be mechanically and electrically coupled to respective pads. The die connectors may be formed by, for example, plating, or the like. The die connectors provide an electrical connection to respective integrated circuits of IC dies 300a, 300b.

Insulating features 350a, 350b may comprise insulating material disposed on active sides of IC dies 300a, 300b, such as on the passivation films and the die connectors. The insulating material may laterally encapsulate the die connectors and may be substantially laterally co-terminus with lateral extents of respective IC dies 300a, 300b. The insulating material may be a polymer (e.g., PBO, polyimide, BCB), a nitride (e.g., silicon nitride), an oxide (e.g., silicon oxide), a glass (e.g., PSG, BSG, BPSG), a dielectric material, and/or the like, or a combination thereof, and may be formed, for example, by spin coating, lamination, CVD, or the like.

Before being adhered to insulating layer 120, IC dies 300a, 300b may be processed according to applicable manufacturing processes to form integrated circuits in IC dies 300a, 300b. For example, IC dies 300a, 300b may each comprise a semiconductor substrate, such as silicon (doped or undoped) or an active layer of a semiconductor-on-insulator (SOI) substrate. A semiconductor substrate may include other semiconductor material, e.g., germanium, a compound semiconductor (e.g., silicon carbide, gallium arsenic, gallium phosphide, indium phosphide, indium arsenide, indium antimonide), an alloy semiconductor (e.g., SiGe, GaAsP, AlInAs, AlGaAs, GaInAs, GaInP, GaInAsP), and/or the like. Other substrates, such as multi-layered or gradient substrates, may also be used. Devices, such as transistors, diodes, capacitors, resistors, inductors, etc., may be formed in and/or on the semiconductor substrate, and may be interconnected by interconnect structures formed by, e.g., metallization patterns in one or more insulating layers on the semiconductor substrate to form an integrated circuit.

Adhesive 310a, 310b is disposed on back-side surfaces of IC dies 300a, 300b, respectively, and adheres IC dies 300a, 300b to insulating layer 120 (or, in alternative embodiments later described herein, respective back-side redistribution structures). Adhesive 310a, 310b may be any suitable adhesive, epoxy, die attach film (DAF), or the like. Adhesive 310a, 310b may be applied to a back-side of IC dies 300a, 300b prior to die placement, such as to a back-side of a respective semiconductor wafer. IC dies 300a, 300b may be subsequently singulated (e.g., such as by sawing or dicing) while adhered to insulating layer 120 by adhesive 310a, 310b using, e.g., a pick-and-place tool.

Figure 4:
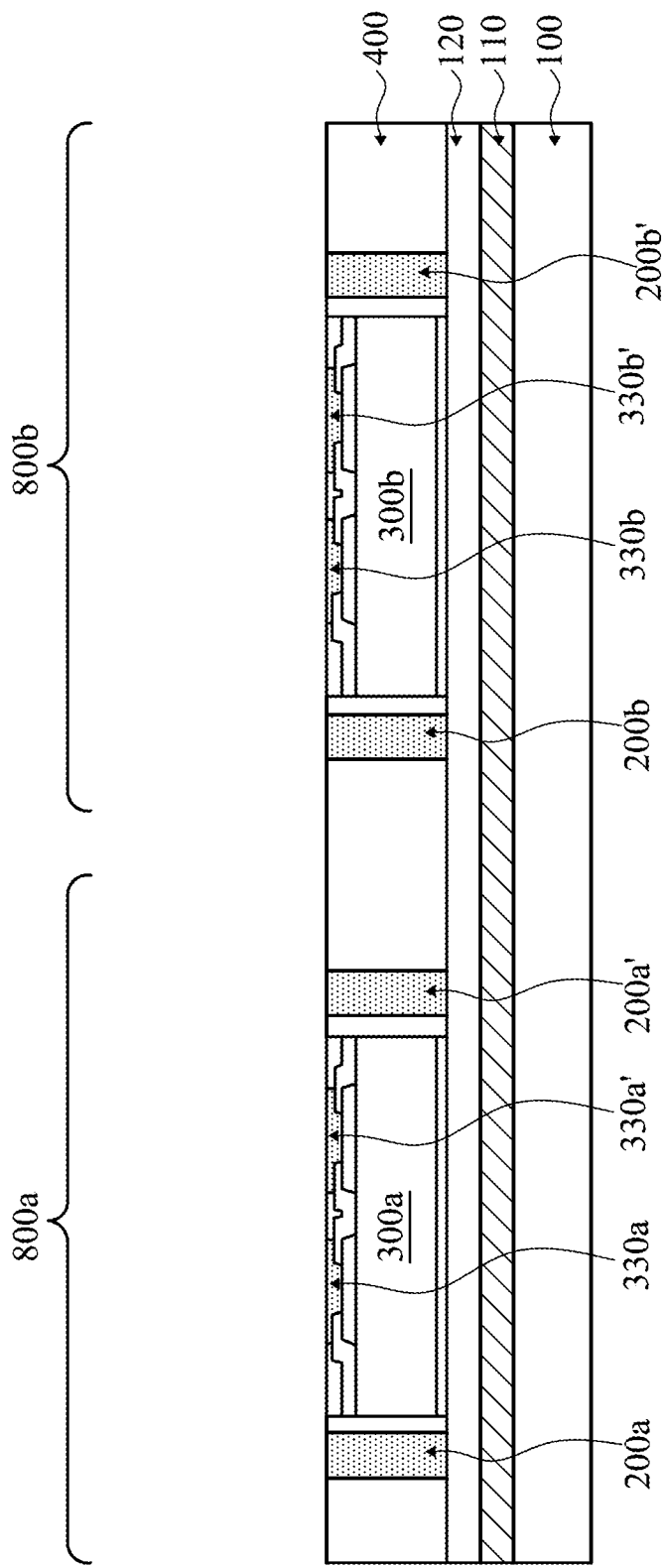

As representatively illustrated in FIG. 4, an encapsulant 400 is formed on and between various components. Encapsulant 400 may at least laterally encapsulate IC dies 300a, 300b and electrical connectors 200a, 200a', 200b, 200b'. Encapsulant 400 may be a molding compound, epoxy, or the like, and may be applied by compression molding, transfer molding, or the like. After curing, encapsulant 400 may undergo a grinding or other planarization process to expose electrical connectors 200a, 200a', 200b, 200b' and die connectors 330a, 330a', 330b, 330b'. Top surfaces of electrical connectors 200a, 200a', 200b, 200b', die connectors 330a, 330a', 330b, 330b', and encapsulant 400 may be substantially co-planar (or otherwise share a substantially common topography) after planarization. In some embodiments, grinding or planarization may be omitted; for example, if electrical connectors 200a, 200a', 200b, 200b' and die connectors 330a, 330a', 330b, 330b' are already exposed.

FIGS. 5 through 8 representatively illustrate formation of a front-side redistribution structure. As representatively illustrated in FIG. 8, the front-side redistribution structure comprises insulating layers 500, 600, 700, metallization patterns 510, 610, 710, and insulating layer 810.

Figure 5:
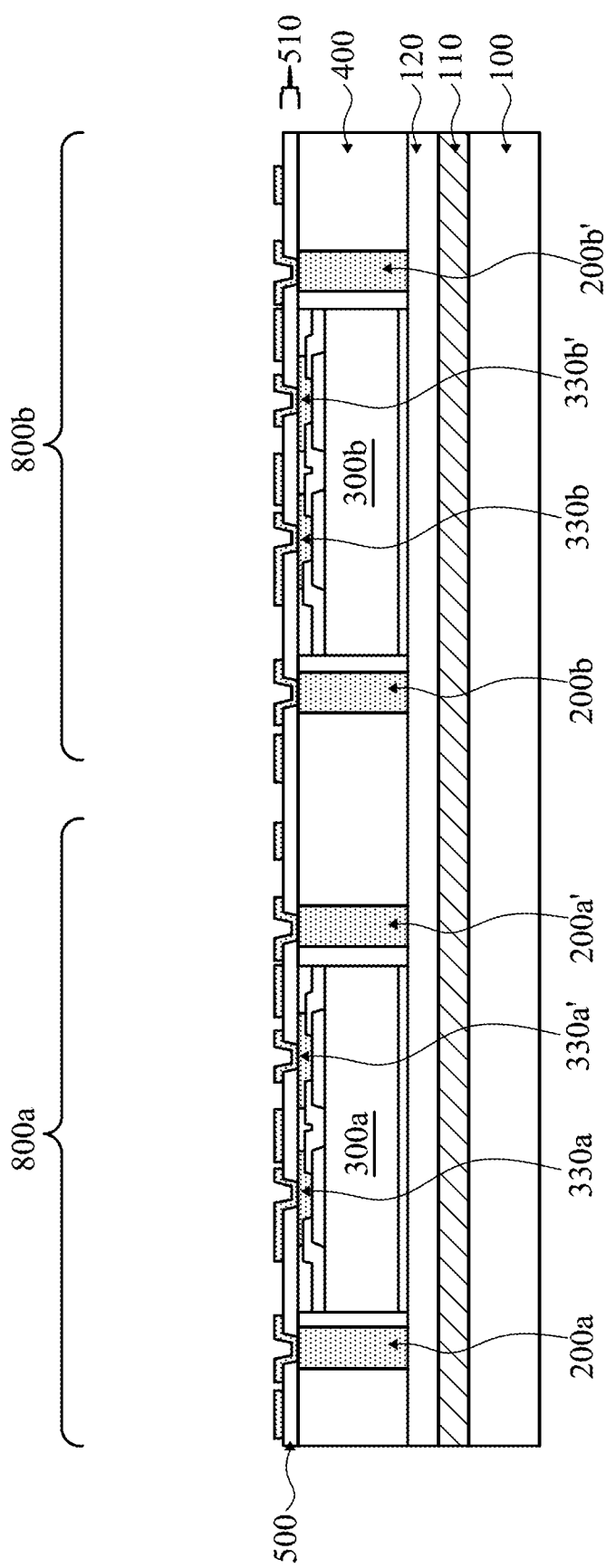

As representatively illustrated in FIG. 5, insulating layer 500 is deposited on encapsulant 400, electrical connectors 200a, 200a', 200b, 200b', and die connectors 330a, 330a', 330b, 330b'. In some embodiments, insulating layer 500 is formed from and comprises a polymer, which may be a photo-sensitive material such as PBO, polyimide, BCB, or the like, that may be patterned using a lithography mask. In other embodiments, insulating layer 500 may be formed of a nitride (e.g., silicon nitride), an oxide (e.g., silicon oxide), a glass (e.g., PSG, BSG, BPSG), a dielectric material, and/or the like, or a combination thereof. Insulating layer 500 may be formed by spin coating, lamination, CVD, or the like, or a combination thereof.

Insulating layer 500 is patterned to form openings to expose portions of electrical connectors 200a, 200a', 200b, 200b' and die connectors 330a, 330a', 330b, 330b'. Patterning may be accomplished by any suitable process, such as by employing lithographic exposure of a photo-sensitive material, followed by development and etching; e.g., an anisotropic etch. If insulating layer 500 is a photo-sensitive material, insulating layer 500 can be patterned by exposing, developing, and curing the photosensitive material in accordance with the desired pattern.

Metallization pattern 510 with vias may be formed on insulating layer 500. For example, a seed layer (not shown) may be formed over insulating layer 500 and in openings through insulating layer 500. In some embodiments, the seed layer may comprise a metal layer, which may be a single layer or a composite layer having a plurality of sub-layers formed of different materials. In some embodiments, the seed layer comprises a titanium layer and a copper layer over the titanium layer. The seed layer may be formed using, for example, PVD, or the like. Photoresist may then be formed and patterned on the seed layer. The photoresist may be formed by spin coating, or the like, and may be exposed to light for patterning. The pattern of the photoresist corresponds to subsequently formed metallization pattern 510. Patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, e.g., copper, titanium, tungsten, aluminum, or the like. Thereafter, photoresist and portions of the seed layer on which the conductive material is not formed are removed. The photoresist may be removed by an acceptable ashing or stripping process, e.g., using an oxygen plasma, or the like. Once the photoresist is removed, exposed portions of the seed layer may be removed, such as by using an acceptable etching process, e.g., wet or dry etching. Remaining portions of the seed layer and conductive material form the metallization pattern 510 with vias. The vias of metallization pattern 510 are formed in openings through the insulating layer 500 to electrical connectors 200a, 200a', 200b, 200b' and die connectors 330a, 330a', 330b, 330b'. In other embodiments, the metallization pattern may be formed by depositing a conductive layer and patterning the conductive layer.

Figure 6:
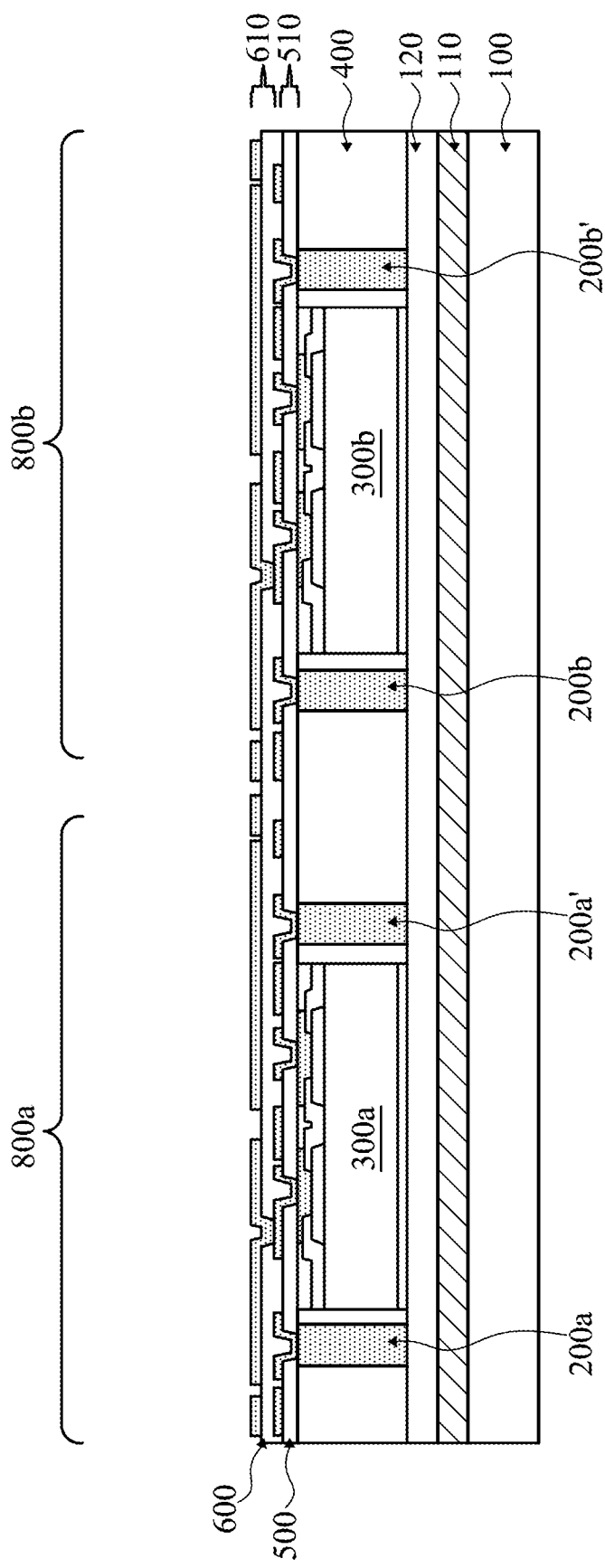

As representatively illustrated in FIG. 6, insulating layer 600 is deposited over and on metallization pattern 510 and insulating layer 500. In some embodiments, insulating layer 600 is formed of a polymer, which may be a photo-sensitive material such as PBO, polyimide, BCB, or the like, that may be patterned using a lithography mask. In other embodiments, insulating layer 600 may be formed of a nitride (e.g., silicon nitride), an oxide (e.g., silicon oxide), a glass (e.g., PSG, BSG, BPSG), a dielectric material, and/or the like, or a combination thereof. Insulating layer 600 may be formed by spin coating, lamination, CVD, or the like, or a combination thereof.

Insulating layer 600 is patterned to form openings to expose portions of metallization pattern 510. Patterning may be accomplished by any suitable process, such as by employing lithographic exposure of a photo-sensitive material, followed by development and etching; e.g., an anisotropic etch. If insulating layer 600 is a photo-sensitive material, insulating layer 600 can be patterned by exposing, developing, and curing the photosensitive material in accordance with the desired pattern.

Metallization pattern 610 with vias may be formed on insulating layer 600 in a substantially similar manner as discussed above with reference to metallization pattern 510 with vias on insulating layer 500.

Figure 7:
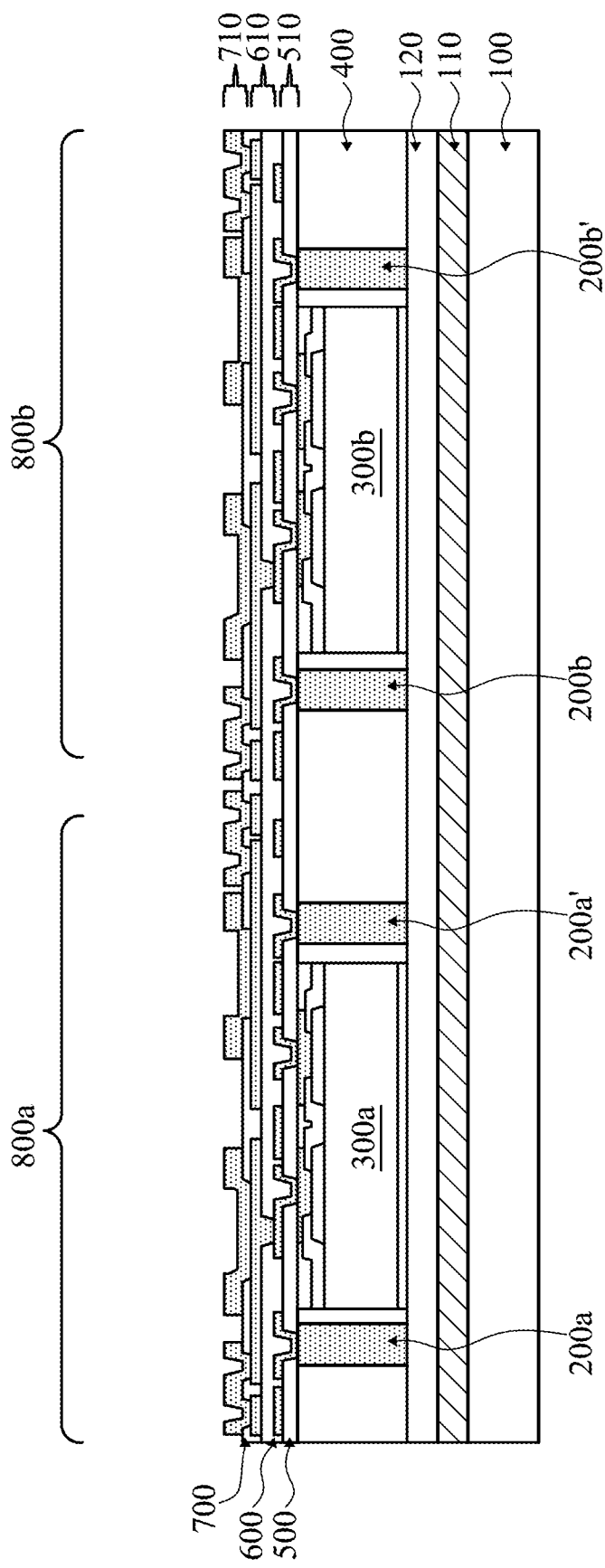

As representatively illustrated in FIG. 7, insulating layer 700 is deposited over and on metallization pattern 610 and insulating layer 600. In some embodiments, insulating layer 700 is formed of a polymer, which may be a photo-sensitive material such as PBO, polyimide, BCB, or the like, that may be patterned using a lithography mask. In other embodiments, insulating layer 700 may be formed of a nitride (e.g., silicon nitride), an oxide (e.g., silicon oxide), a glass (e.g., PSG, BSG, BPSG), a dielectric material, and/or the like, or a combination thereof. Insulating layer 700 may be formed by spin coating, lamination, CVD, or the like, or a combination thereof.

Insulating layer 700 is patterned to form openings to expose portions of metallization pattern 610. Patterning may be accomplished by any suitable process, such as by employing lithographic exposure of a photo-sensitive material, followed by development and etching. If insulating layer 700 is a photo-sensitive material, insulating layer 700 can be patterned by exposing, developing, and curing the photosensitive material in accordance with the desired pattern.

Metallization pattern 710 with vias may be formed on insulating layer 700 in a substantially similar manner as discussed above with reference to metallization pattern 510 with vias on insulating layer 500.

In a representative embodiment insulating layer 500 and metallization pattern 510 comprise a first RDL, insulating layer 600 and metallization pattern 610 comprise a second RDL, and metallization pattern 710 comprises a UBM layer. Accordingly, a representative front-side redistribution structure may comprise a first RDL (e.g., first insulating layer 500, first metallization pattern 510), a second RDL (e.g., second insulating layer 600, second metallization pattern 610), and a UBM layer (e.g., third insulating layer 700, third metallization pattern 710). In various other embodiments, more or fewer insulating layers and metallization patterns may be formed in a front-side redistribution structure. If fewer insulating layers and metallization patterns are to be formed, representative steps and processes discussed above may be omitted. If more insulating layers and metallization patterns are to be formed, representative steps and processes discussed above may be repeated. One having ordinary skill in the art will readily understand which steps and processes would be omitted or repeated.

Accordingly, various representative embodiments provide a path of electrical routing (as later discussed with reference to FIGS. 16a, 16b, and 16c) from a portion of a UBM layer, down to an RDL line, up to a UBM pad of the UBM layer, then to an external interconnect electrically connected to the UBM pad.

Figure 8:
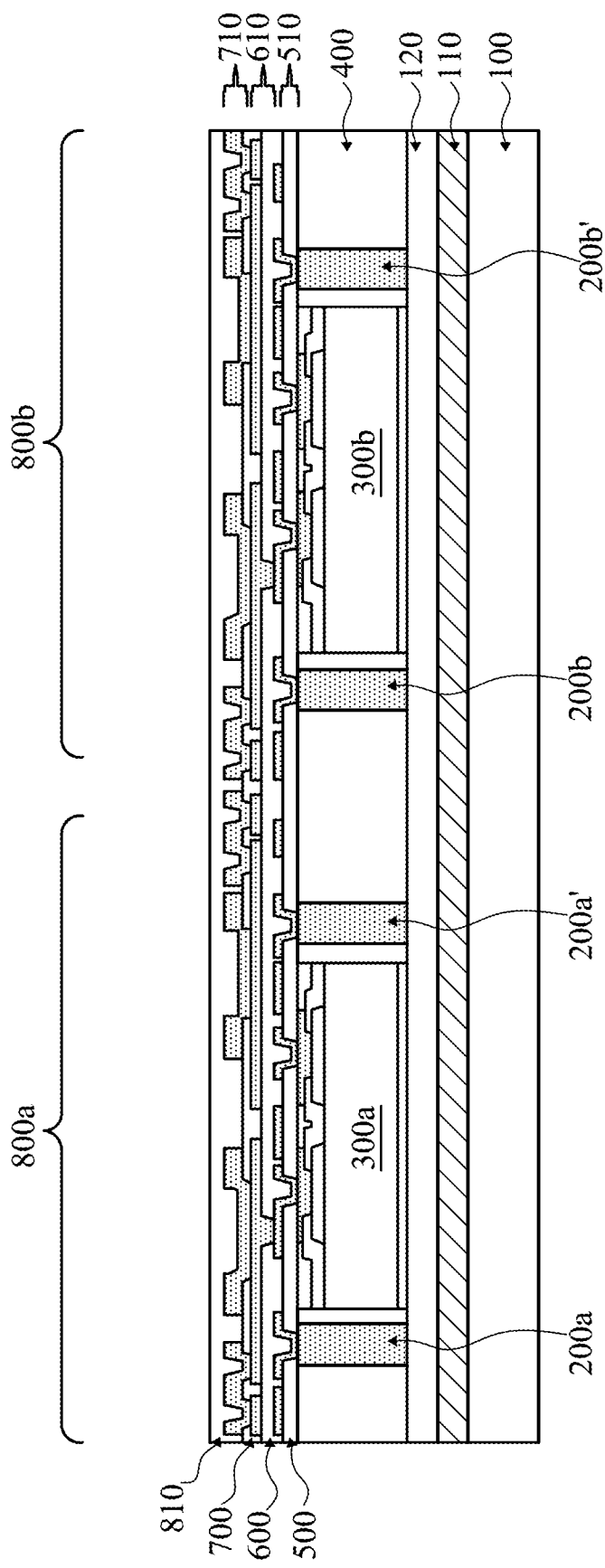

As representatively illustrated in FIG. 8, insulating layer 810 is deposited over and on metallization pattern 710 and insulating layer 700. In some embodiments, insulating layer 810 may comprise a polymer, which may be a photo-sensitive material such as PBO, polyimide, BCB, or the like, that may be patterned using a lithography mask. In other embodiments, insulating layer 810 may be formed of a nitride (e.g., silicon nitride), an oxide (e.g., silicon oxide), a glass (e.g., PSG, BSG, BPSG), a dielectric material, and/or the like. Insulating layer 810 may be formed by spin coating, lamination, CVD, or the like, or a combination thereof.

Figure 9:
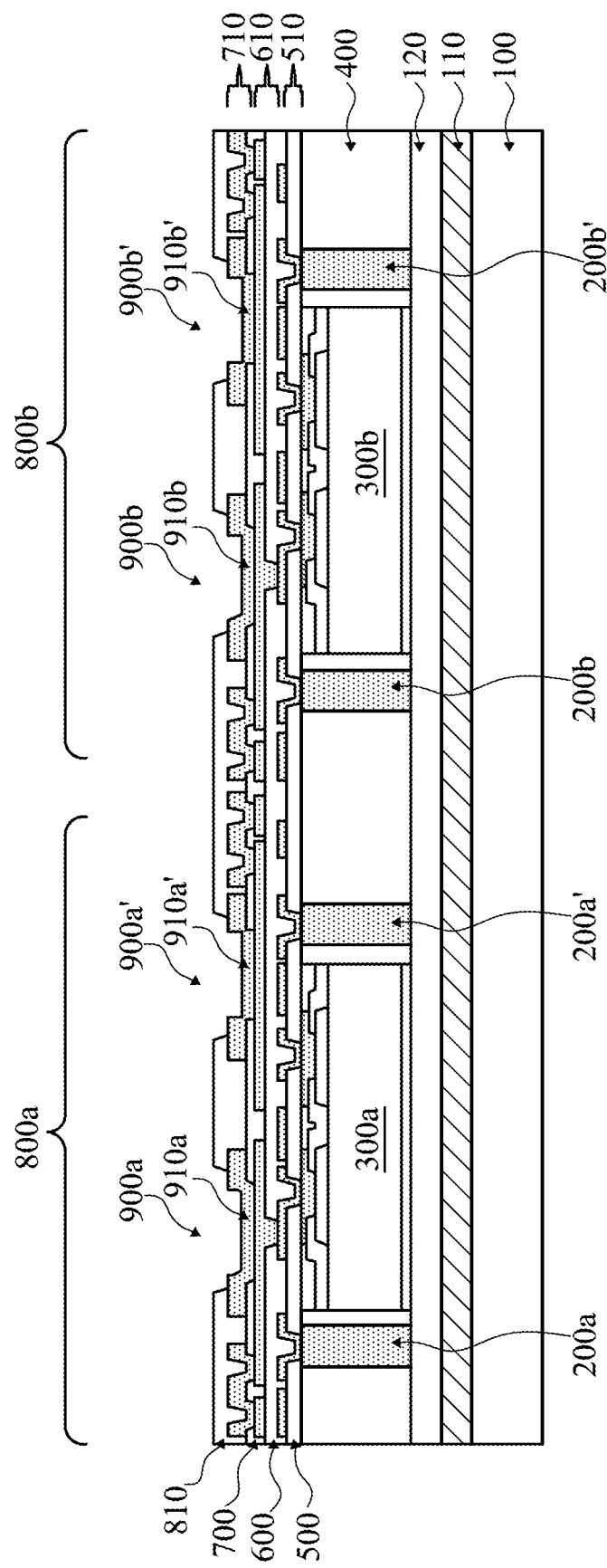

As representatively illustrated in FIG. 9, insulating layer 810 is patterned to form openings 900a, 900a', 900b, 900b' to expose portions (e.g., UBM pad portions 910a, 910a', 910b, 910b') of metallization pattern 710. Openings 900a, 900a', 900b, 900b' are formed on an exterior side of the front-side redistribution structure. Patterning may be accomplished by any suitable process, such as by employing lithographic exposure of a photo-sensitive material, followed by development and etching. Subsequent to forming openings 900a, 900a', 900b, 900b', a trace portion (1690 as later described with reference to FIG. 16c) of UBM metallization pattern 710 remains covered by material of insulating layer 810.

Figure 10:
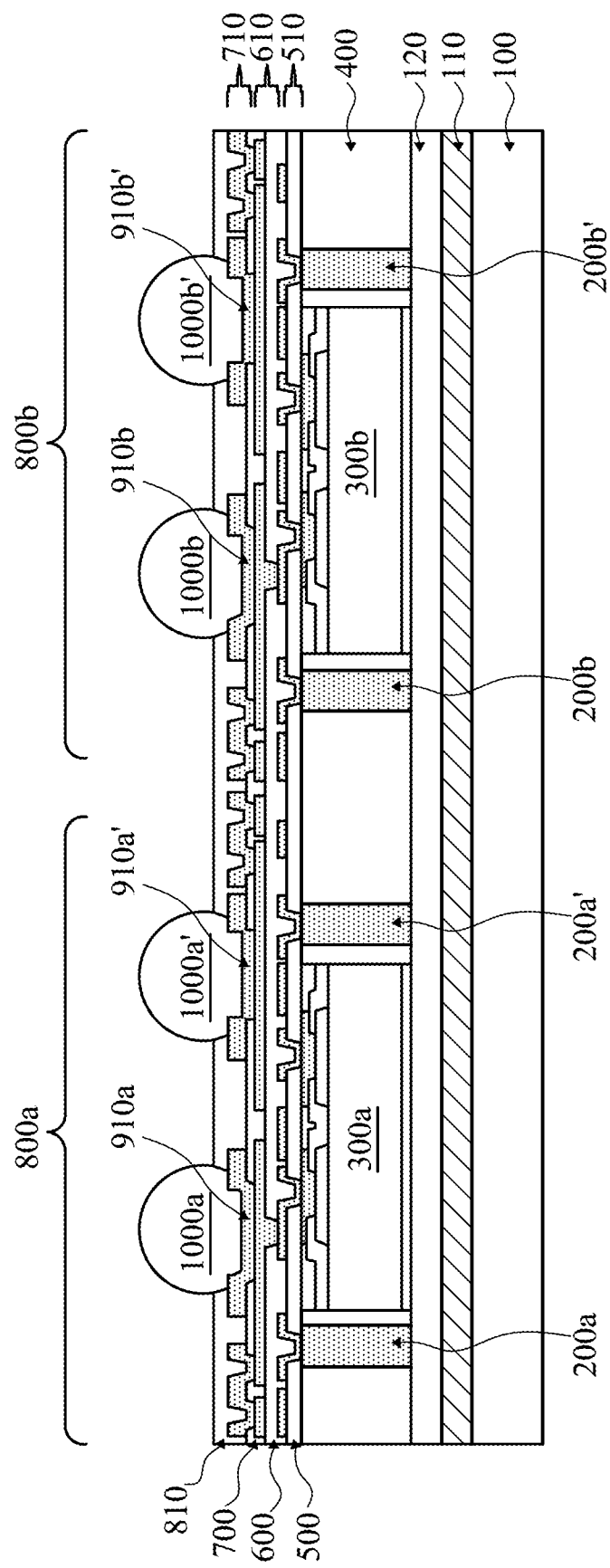
Figure 11:
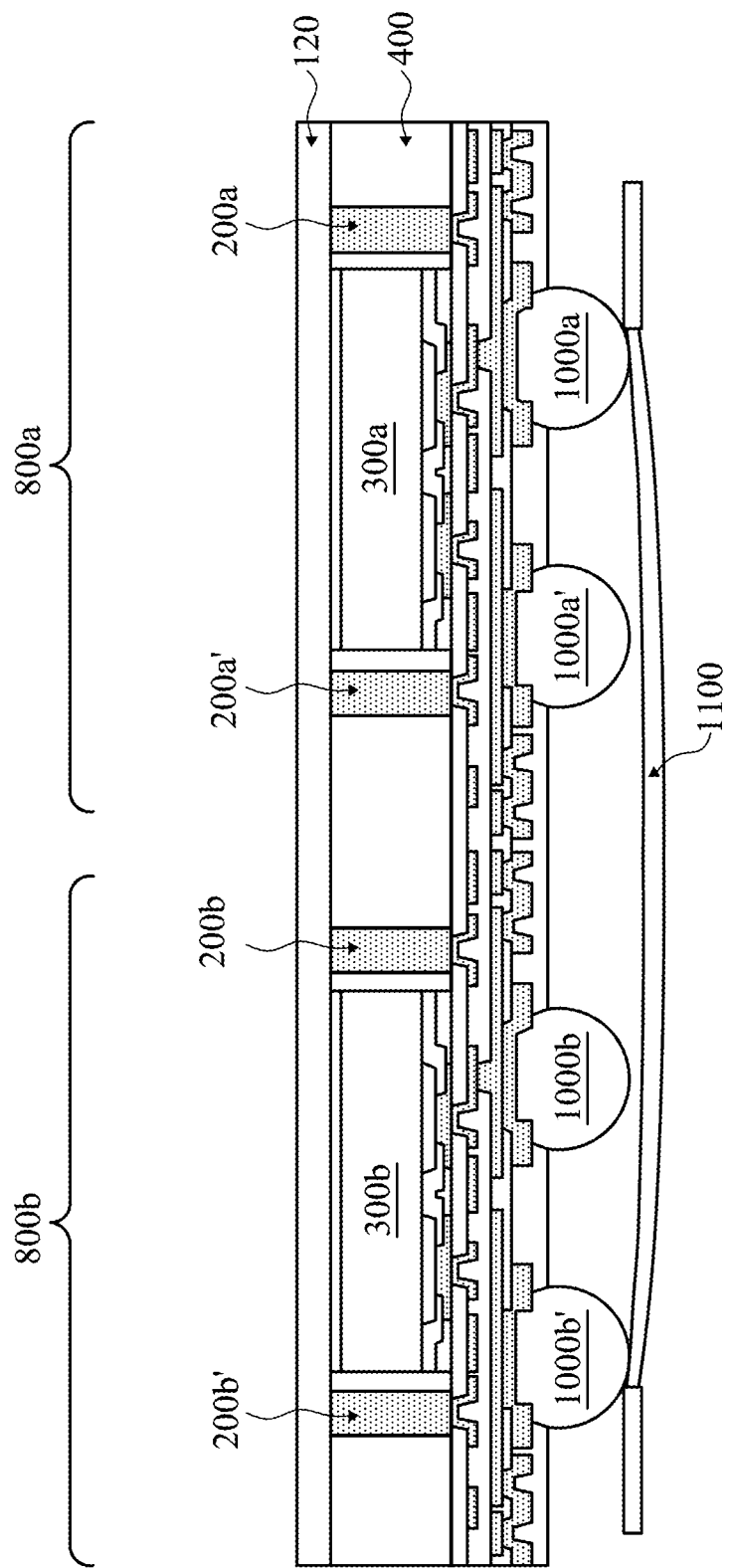

As representatively illustrated in FIG. 10, conductive connectors 1000a, 1000a', 1000b, 1000b' are formed on and coupled to UBM pad portions 910a, 910a', 910b, 910b' of metallization pattern 710. Conductive connectors 1000a, 1000a', 1000b, 1000b' may comprise ball grid array (BGA) connectors, solder balls, metal pillars, controlled collapse chip connection (C4) bumps, micro bumps, electroless nickel-electroless palladium-immersion gold technique (ENEPIG) formed bumps, or the like. Conductive connectors 1000a, 1000a', 1000b, 1000b' may include a conductive material such as solder, copper, aluminum, gold, nickel, silver, palladium, tin, or the like, or a combination thereof. In some embodiments, conductive connectors 1000a, 1000a', 1000b, 1000b' may be formed by initially depositing a layer of solder with commonly used methods, e.g., evaporation, electroplating, printing, solder transfer, ball placement, or the like. Once a layer of solder has been formed on the structure, a reflow may be performed in order to shape the material into the desired bump shapes. In another embodiment, conductive connectors 1000a, 1000a', 1000b, 1000b' may comprise metal pillars (e.g., a copper pillar) formed by sputtering, printing, electroplating, electroless plating, CVD, or the like. The metal pillars may be substantially solder-free and have substantially vertical sidewalls. In some embodiments, a metal cap layer may be formed on the top of the metal pillar connectors. The metal cap layer may include nickel, tin, tin-lead, gold, silver, palladium, indium, nickel-palladium-gold, nickel-gold, or the like, or a combination thereof, and may be formed by a plating process. In accordance with a representative embodiment, conductive connectors 1000a, 1000a', 1000b, 1000b' may comprise solder balls having a diameter ranging from, e.g., about 150 µm to about 300 µm.

Figure 16A:
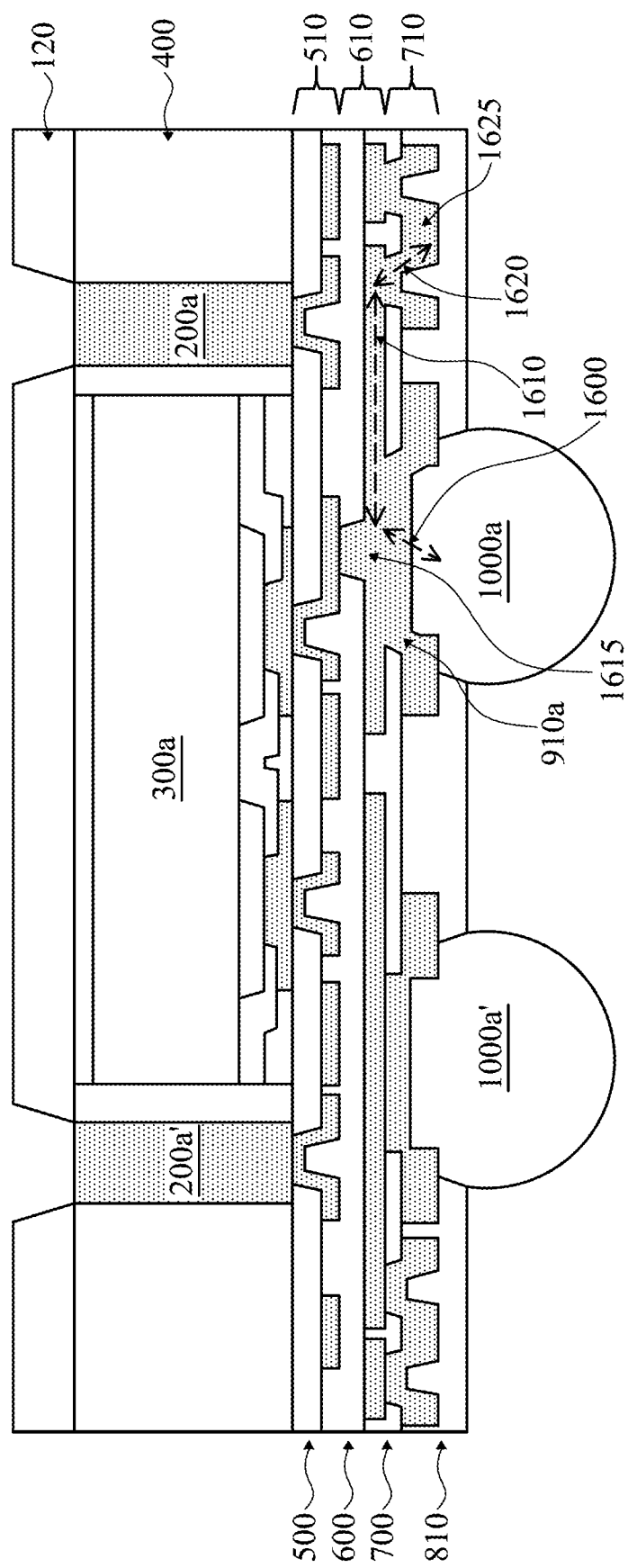
FIGS. 16a, 16b, and 16c illustrate cross-sectional views of various under bump metallurgy (UBM) and redistribution layer (RDL) routing features of a first package structure, in accordance with some embodiments.
Figure 16B:
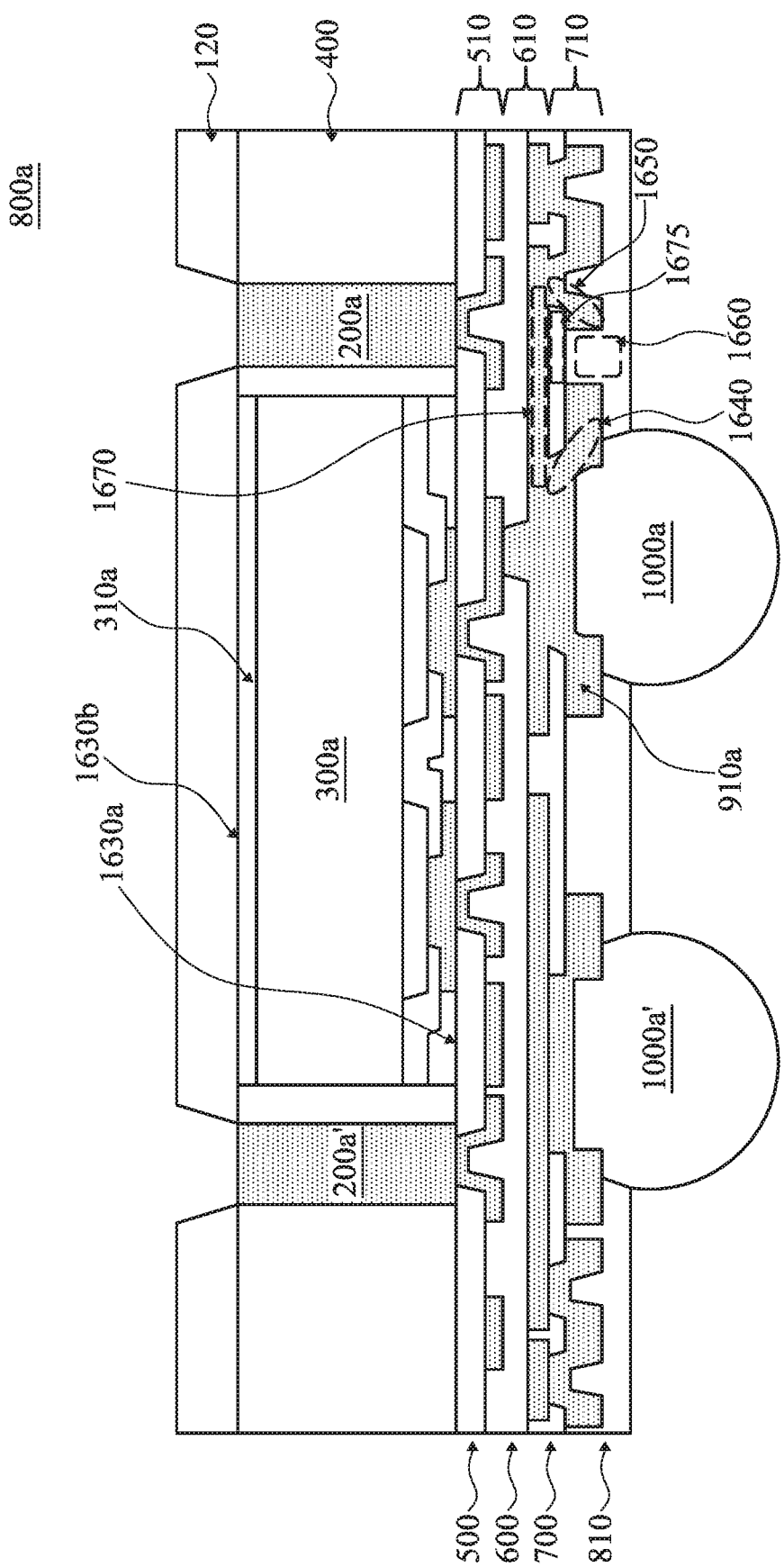
Figure 16C:
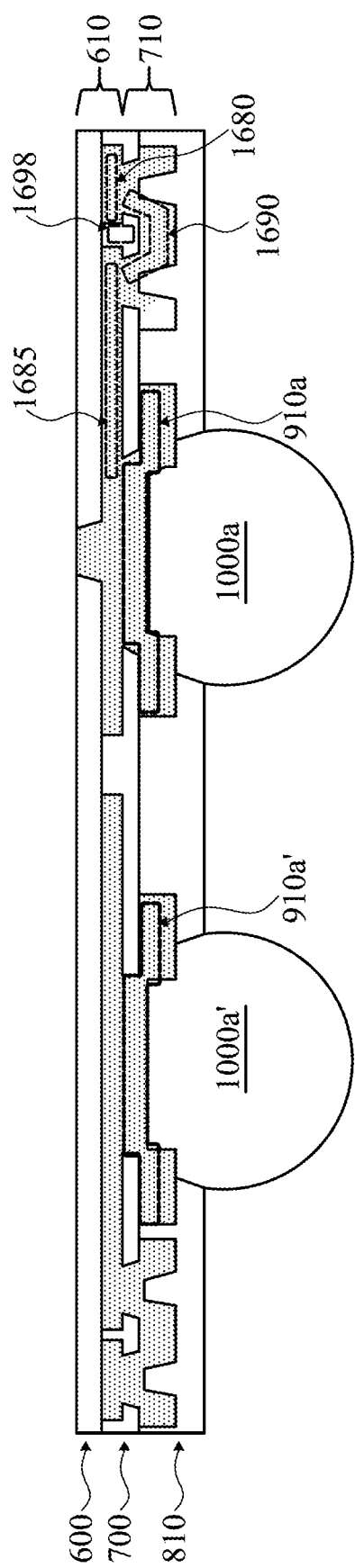

As representatively illustrated in FIG. 10 (with benefits and advantages further described herein with reference to FIGS. 16a, 16b, and 16c), a representative UBM/RDL structure is provided for routing UBM electrical signals through underlying RDL portions, as compared to, e.g., direct routing through a UBM layer alone.

Testing may be performed after conductive connectors 1000a, 1000a', 1000b, 1000b' have been formed, e.g., to identify defective package structures. Thereafter, as representatively illustrated in FIG. 11, a carrier substrate de-bonding procedure may be performed to detach (de-bond) carrier substrate 100 from insulating layer 120 (or in accordance with other representative embodiments, a back-side redistribution structure). In accordance with some embodiments, de-bonding includes projecting electromagnetic energy (e.g., laser, UV, or the like) on the release layer 110 so that the release layer 110 decomposes, or otherwise detaches, to permit removal of carrier substrate 100. The structure is then flipped over and placed on a tape 1100 for further processing.

In accordance with an alternative embodiment, plural insulating layers and metallization layers may be formed over insulating layer 120 before formation of electrical connectors 200a, 200a', 200b, 200b' or after carrier substrate 100 removal to produce a back-side redistribution structure that includes one or more insulating layers and one or more metallization layers. Back-side redistribution structures so formed may include any number of insulating layers, metallization patterns, and vias. For example, vias may be formed during the formation of a metallization pattern by forming a seed layer and conductive material of the metallization pattern in an opening of underlying insulating layers. The vias may therefore interconnect and electrically couple various metallization layers in a resulting back-side redistribution structure. The back-side redistribution structure may be formed in a similar manner as discussed above with reference to formation of front-side RDLs.

Figure 12:
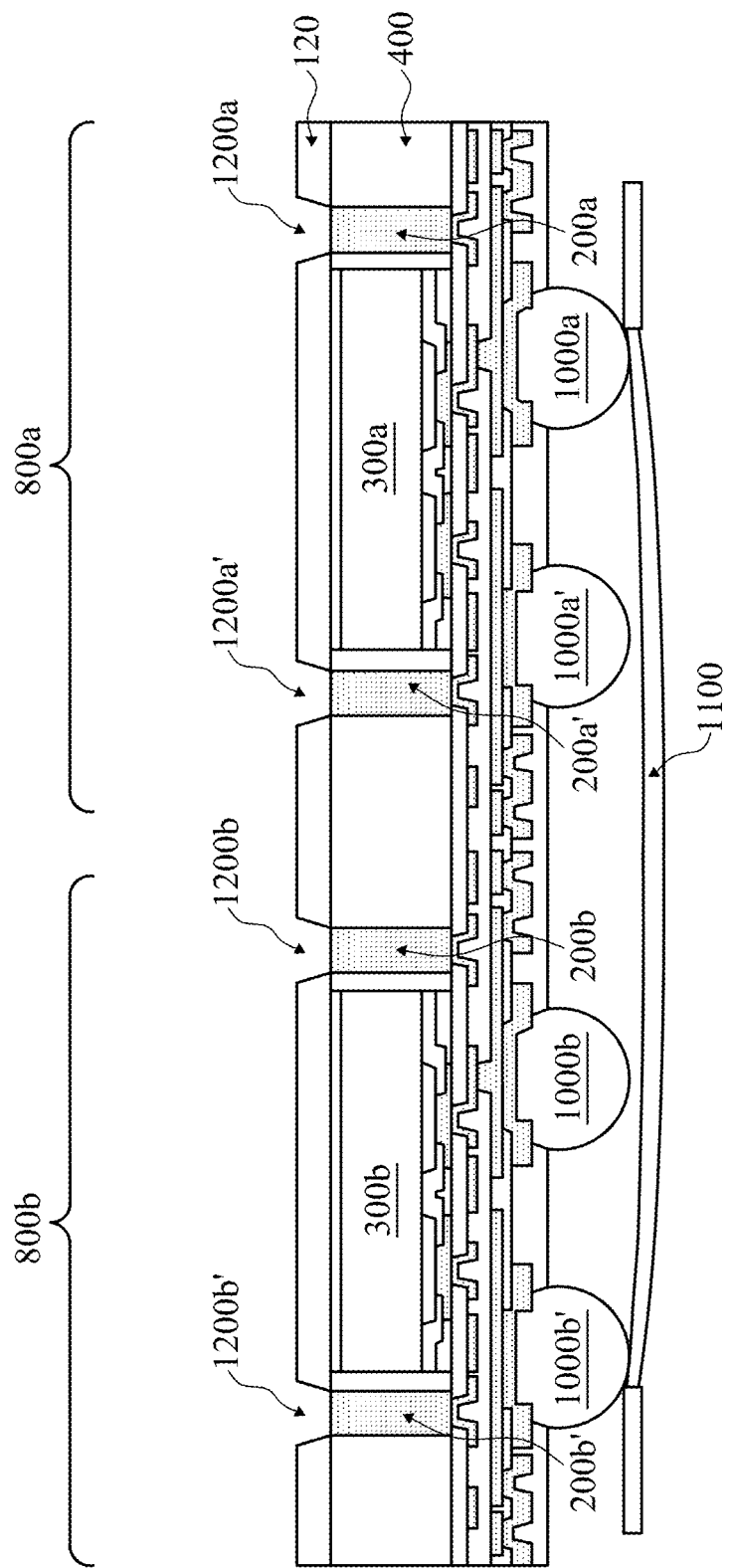

As representatively illustrated in FIG. 12, insulating layer 120 is patterned to form openings 1200b', 1200b, 1200a', 1200a to expose back-side portions of electrical connectors 200b', 200b, 200a', 200a. Patterning may be accomplished by any acceptable process, such as by employing lithographic exposure of a photo-sensitive material, followed by development and etching. If insulating layer 120 is a photo-sensitive material, insulating layer 120 can be developed after exposure. Alternatively, openings 1200b', 1200b, 1200a', 1200a may be formed by laser drilling, or the like.

Figure 13:
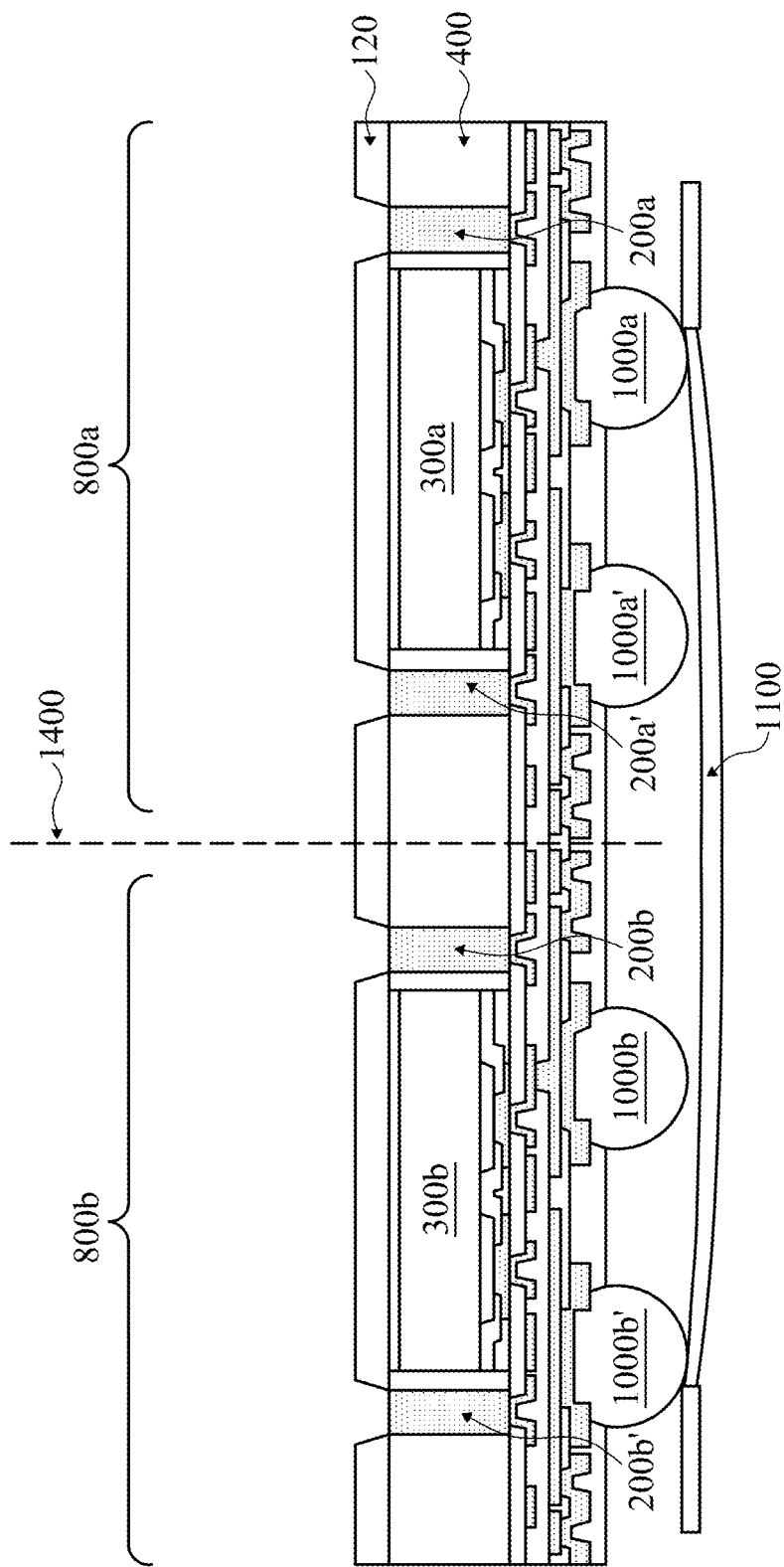
Figure 14:
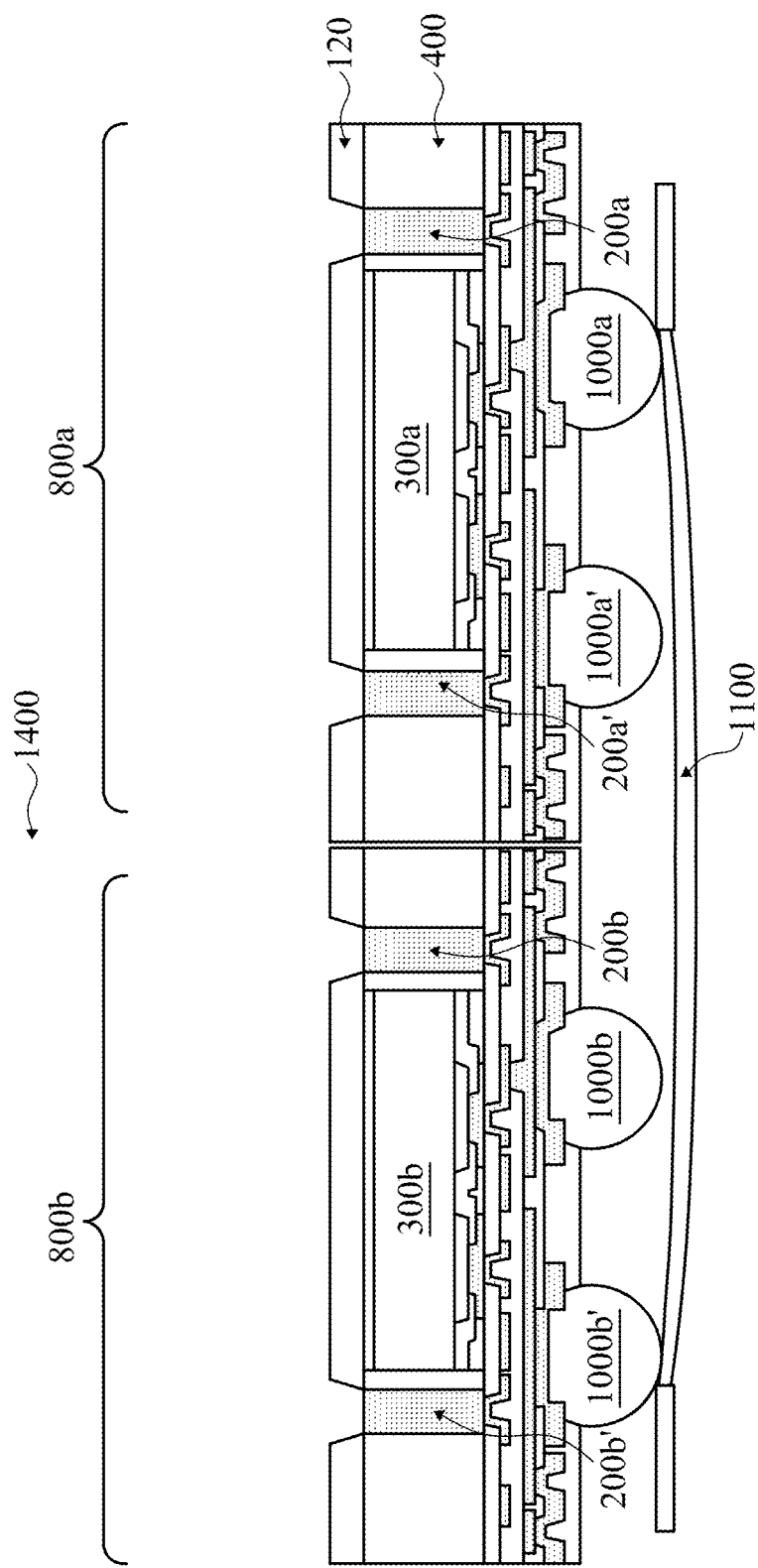
Figure 15:
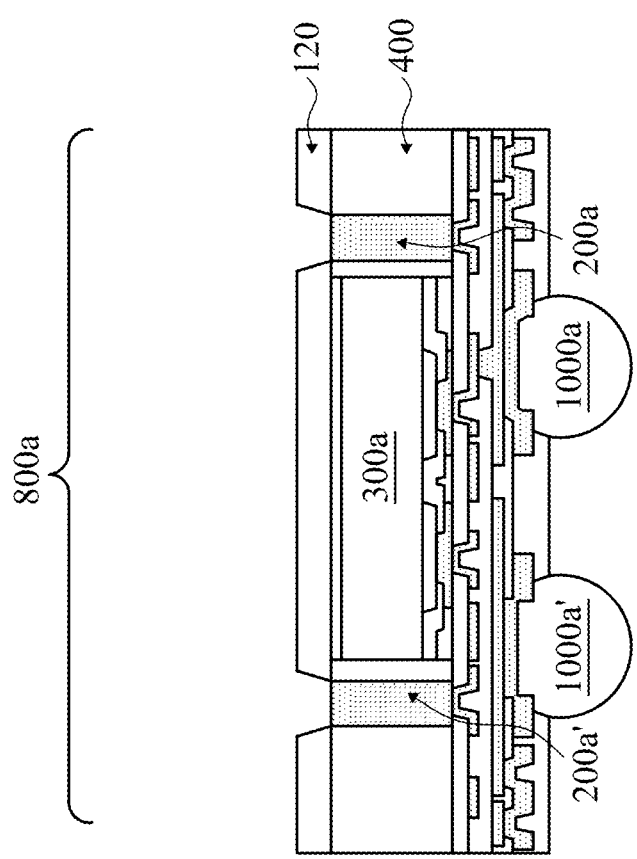

As representatively illustrated in FIG. 13 and FIG. 14, packages 800a, 800b are singulated to produce discrete packages. Singulation may be performed by sawing along scribe line 1400, e.g., between adjacent package regions 800a and 800b. Sawing separates first package region 800a from second package region 800b. In an embodiment, singulation produces discrete package 800a, as representatively illustrated in FIG. 15 after removal from tape 1100. In accordance with various representative embodiments, discrete package 800a may comprise an integrated fan-out (InFO) package.

In accordance with an embodiment, as representatively illustrated in FIG. 16a, discrete package 800a may be configured to provide a first electrical connection 1600 to/from a UBM pad 910a of metallization pattern 710 (and conductive connector 1000a coupled thereto) from/to a conductive line 1615 of underlying metallization pattern 610, a second electrical connection 1610 along conductive line 1615 in metallization pattern 610, and a third electrical connection 1620 to/from conductive line 1615 from/to a UBM layer portion 1625 of overlying metallization pattern 710. The second electrical connection 1610 provides an electrical connection between the first electrical connection 1600 and the third electrical connection 1620, such that UBM layer portion 1625 of metallization pattern 710 is in electrical connection (but otherwise not in mechanical or physical contact) with UBM pad 910a. Consequently, electrical signals can be routed through underlying redistribution layers (for the benefit of, e.g., added protection afforded by overlying material layers) before being routed to laterally disposed portions of overlying UBM metallization pattern 710. Accordingly, UBM metallization pattern 710, in addition to providing one or more points of external connection to/from discrete package 800a, also provides electrical routing within discrete package 800a.

As representatively illustrated in FIG. 16b, a package 800a includes molding compound 400 at least laterally encapsulating IC die 300a and adjacent electrical connectors 200a, 200a'. Insulating layers 500, 600, 700 are disposed over a top surface 1630a of IC die 300a, molding compound 400, and electrical connectors 200a, 200a'. Insulating layer 500 and metallization layer 510 comprise a first RDL. Insulating layer 600 and metallization layer 610 comprise a second RDL. Metallization layer 710 comprises a UBM layer. Bottom surface 1630b of IC die 300a (as provided for attachment to insulating layer 120) comprises an adhesive layer 310a in contact with back-side insulating layer 120. At least a portion of conductive connector 1000a is disposed over and on a first portion 1640 of UBM pad 910a in UBM metallization layer 710. A second portion 1650 of UBM metallization layer 710 is separated from the first portion 1640 by insulating material portion 1660 (a first insulating region) of insulating layer 810. A third portion 1670 of RDL metallization layer 610 electrically couples the first portion 1640 to the second portion 1650. First portion 1640, second portion 1650, and third portion 1670 are electrically coupled to conductive connector 1000a. Insulating material portion 1675 (a second insulating region) of insulating layer 700 is disposed between and interposes the third portion 1670 of RDL metallization layer 610 and the insulating material portion 1660 of insulating layer 810.

In accordance with a representative embodiment, insulating material portion 1660 comprises a different material layer than insulating material portion 1675 of insulating layer 700. In accordance with another representative embodiment, insulating material portion 1660 comprises a different material than insulating material portion 1675 of insulating layer 700. In accordance with another representative embodiment, the first portion 1640 and the second portion 1650 may comprise a same material layer formed in a same process step. In accordance with a representative aspect, the first portion 1640 and the second portion 1650 of UBM metallization layer 710 may comprise a same material. In another representative embodiment, the first portion 1640 and the second portion 1650 may comprise a different material than the third portion 1670 of RDL metallization layer 610. In an embodiment, metallization layer 610 of the second RDL and metallization layer 710 of the UBM layer electrically connects IC die 300a to conductive connector 1000a.

As generally illustrated in FIG. 16c, an interconnect design in accordance with a representative embodiment for providing a UBM/RDL routing structure (e.g., sans die) is provided. Insulating layer 600 and metallization layer 610 comprise an RDL. Metallization layer 710 comprises a UBM layer. The UBM layer overlies the RDL. At least a portion of a first conductive connector 1000a is disposed over and on a first UBM pad 910a. Conductive connector 1000a is electrically coupled to first UBM pad 910a. A first portion 1680 of RDL metallization layer 610 is separated from a second portion 1685 of RDL metallization layer 610 by insulating material 1698 of RDL insulating layer 700. A UBM trace 1690 is disposed over the RDL and in the UBM metallization layer 710. The UBM trace 1690 electrically couples the first portion 1680 of the RDL to the second portion 1685 of the RDL. UBM metallization layer 710 comprises the first UBM pad 910a. Second portion 1685 of RDL metallization layer 610 is electrically coupled to first UBM pad 910a. Accordingly, first portion 1680 of RDL metallization layer 610 is electrically coupled (thru UBM trace 1690 of the UBM layer, second portion 1685 of metallization layer 610 of the RDL, and first UBM pad 910a of the UBM layer) to conductive connector 1000a. UBM trace 1690 of UBM metallization layer 710 is electrically coupled (thru second portion 1685 of metallization layer 610 of the RDL) to first UBM pad 910a. Notwithstanding the preceding, with respect to metal features within metallization layer 710 of the UBM layer, UBM trace 1690 is not otherwise physically or mechanically coupled to first UBM pad 910a. That is to say, there is no configuration or distribution of metal features within the UBM layer that would physically connect UBM trace 1690 to first UBM pad 910a either directly or indirectly.

In a representative embodiment, metallization layer 710 of the UBM layer comprises a second UBM pad 910a'. At least a portion of a second conductive connector 1000a' is disposed over and on second UBM pad 910a'. Second conductive connector 1000a' is electrically coupled to second UBM pad 910a'. In accordance with a representative embodiment, second conductive connector 1000a' and second UBM pad 910a' are electrically isolated from first UBM pad 910a and first conductive connector 1000a. In another representative embodiment, second UBM pad 910a' and second conductive connector 1000a' are electrically isolated from first portion 1680 in the underlying RDL. In a further representative embodiment, UBM trace 1690 is electrically isolated from second conductive connector 1000a' and second UBM pad 910a'.

In accordance with a representative embodiment, insulating material 1698 of insulating layer 700 comprises a different material layer than insulating material of insulating layer 810. In accordance with a representative embodiment, insulating material 1698 of insulating layer 700 comprises a different material than insulating material of insulating layer 810. In accordance with a representative embodiment, the first portion 1680 and the second portion 1685 of RDL metallization layer 610 may comprise a same material layer formed in a same process step. In accordance with a representative aspect, the first portion 1680 and the second portion 1685 of RDL metallization layer 610 may comprise a same material. In another representative embodiment, the first portion 1680 and the second portion 1685 may comprise a different material than material forming UBM trace 1690.

Accordingly, various representative embodiments provide a path of electrical routing from a portion of a UBM layer, to an underlying RDL line, to a UBM pad of the UBM layer, then to an external interconnect.

Figure 17:
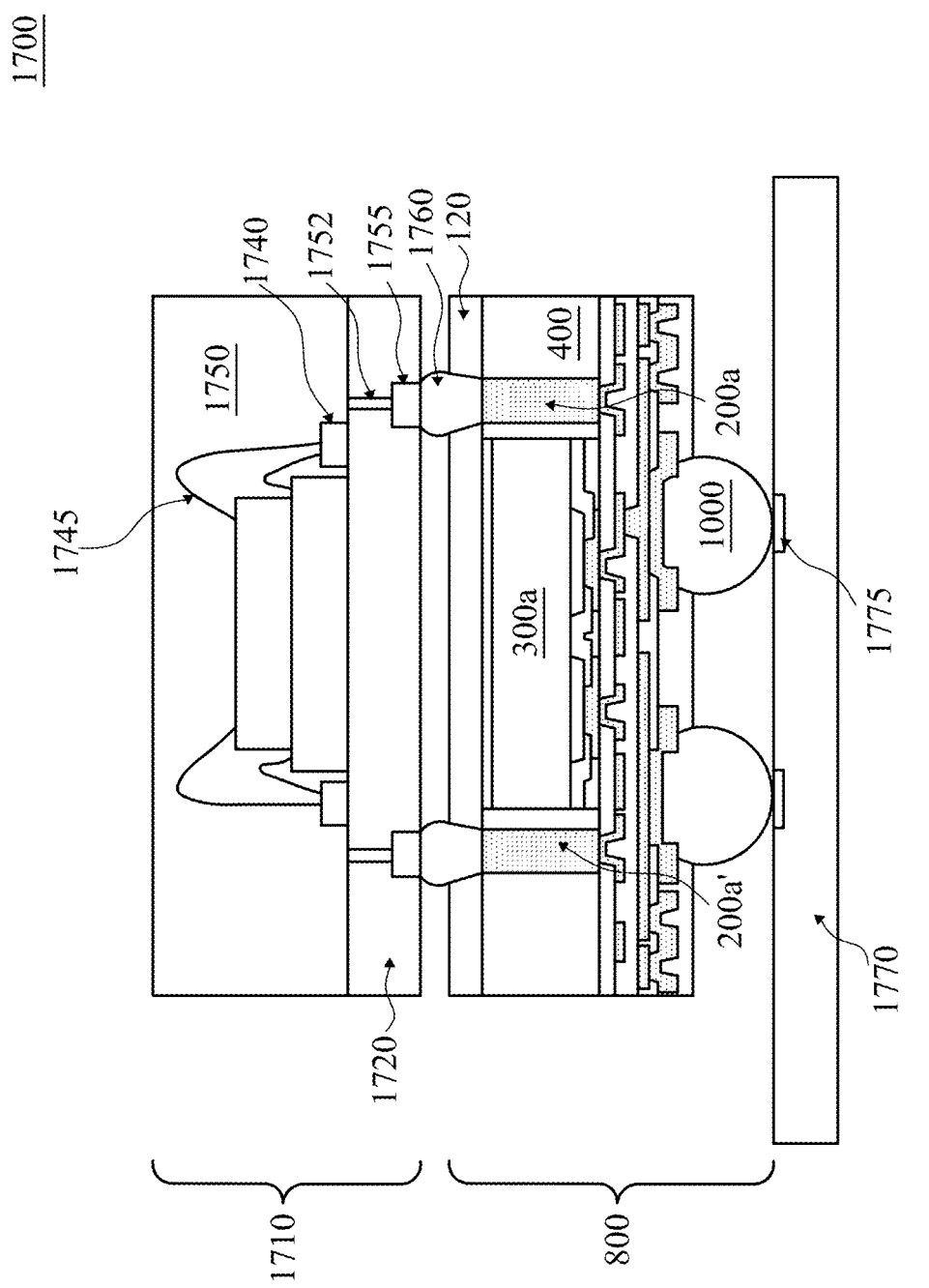
FIG. 17 illustrates a cross-sectional view of a Package-on-Package (PoP) structure, in accordance with some embodiments.

FIG. 17 representatively illustrates a Package-on-Package (PoP) structure 1700 including package 800 (alternatively referred to as a first package), a second package 1710, and a substrate 1770. Second package 1710 includes a substrate 1720 and one or more stacked dies 1730 (1730a and 1730b) coupled to substrate 1720. Substrate 1720 is, in one embodiment, based on an insulating core such as a fiberglass reinforced resin core, and may include contact pad 1775 for mounting conductive connector 1000. A representative core material comprises fiberglass resin such as FR4. Alternatives for the core material include bismaleimide-triazine (BT) resin, or alternatively, other printed circuit board (PCB) materials or films. Build up films, such as Ajinomoto build-up film (ABF) or other laminates, may be used for substrate 1720.

Substrate 1720 may include active and passive devices (not shown in FIG. 17). As one of ordinary skill in the art will appreciate, a variety of devices, such as transistors, capacitors, resistors, inductors, and/or the like, may be used to provide structural and functional requirements of the design for PoP structure 1700. Such devices may be formed using any suitable methods.

Substrate 1720 may also include metallization layers (not shown) and through vias 1752. The metallization layers may be formed over active and passive devices, and are designed to connect various device components to form functional circuitry. The metallization layers may be formed of alternating layers of insulating (e.g., low-k dielectric) and conductive material (e.g., copper), with vias interconnecting the layers of conductive material, and may be formed using any suitable process (e.g., deposition, damascene, dual damascene, or the like). In some embodiments, substrate 1720 is substantially free of active and passive devices.

Substrate 1720 may have bond pads 1740 on a first side of substrate 1720 to couple to stacked dies 1730, and bond pads 1755 on a second side of substrate 1720, the second side being opposite the first side of substrate 1720, to couple to conductive connectors 1760. Stacked dies 1730 are coupled to substrate 1720 by wire bonds 1745, although other connections may be used, such as conductive bumps. In an embodiment, stacked dies 1730 may comprise, e.g., stacked memory dies. For example, stacked memory dies 1730 may include low-power (LP) double data rate (DDR) memory modules, such as LPDDR1, LPDDR2, LPDDR3, or like memory modules, or combinations thereof. In some embodiments, stacked dies 1730 and wire bonds 1745 may be encapsulated by a molding material 1750.

After second packages 1710 are formed, second packages 1710 are bonded to first packages 800 by way of conductive connectors 1760, bond pads 1755, and electrical connectors 200. In some embodiments, stacked memory dies 1730 may be coupled to IC dies 300 through wire bonds 1745, bond pads 1740 and 1755, through vias 1752, conductive connectors 1760, and electrical connectors 200. Conductive connectors 1760 may be similar to conductive connectors 1000 described above, and the description is not repeated herein, although conductive connectors 1760 and 1000 need not be the same.

Semiconductor package 1700 includes packages 800 and 1710 being mounted to a substrate 1770. Substrate 1770 may be referred to as a package substrate 1770. Second package 1710 is mounted to package substrate 1770 through first package 800 using conductive connectors 1000. Package substrate 1770 may include active and passive devices (not shown in FIG. 17). As one of ordinary skill in the art will appreciate, a variety of devices, such as transistors, capacitors, resistors, inductors, and/or the like, may be used to meet structural and functional requirements of the design for PoP package 1700, and may be formed using any suitable methods. In some embodiments, package substrate 1770 is substantially free of active and passive devices.

Figure 18A:
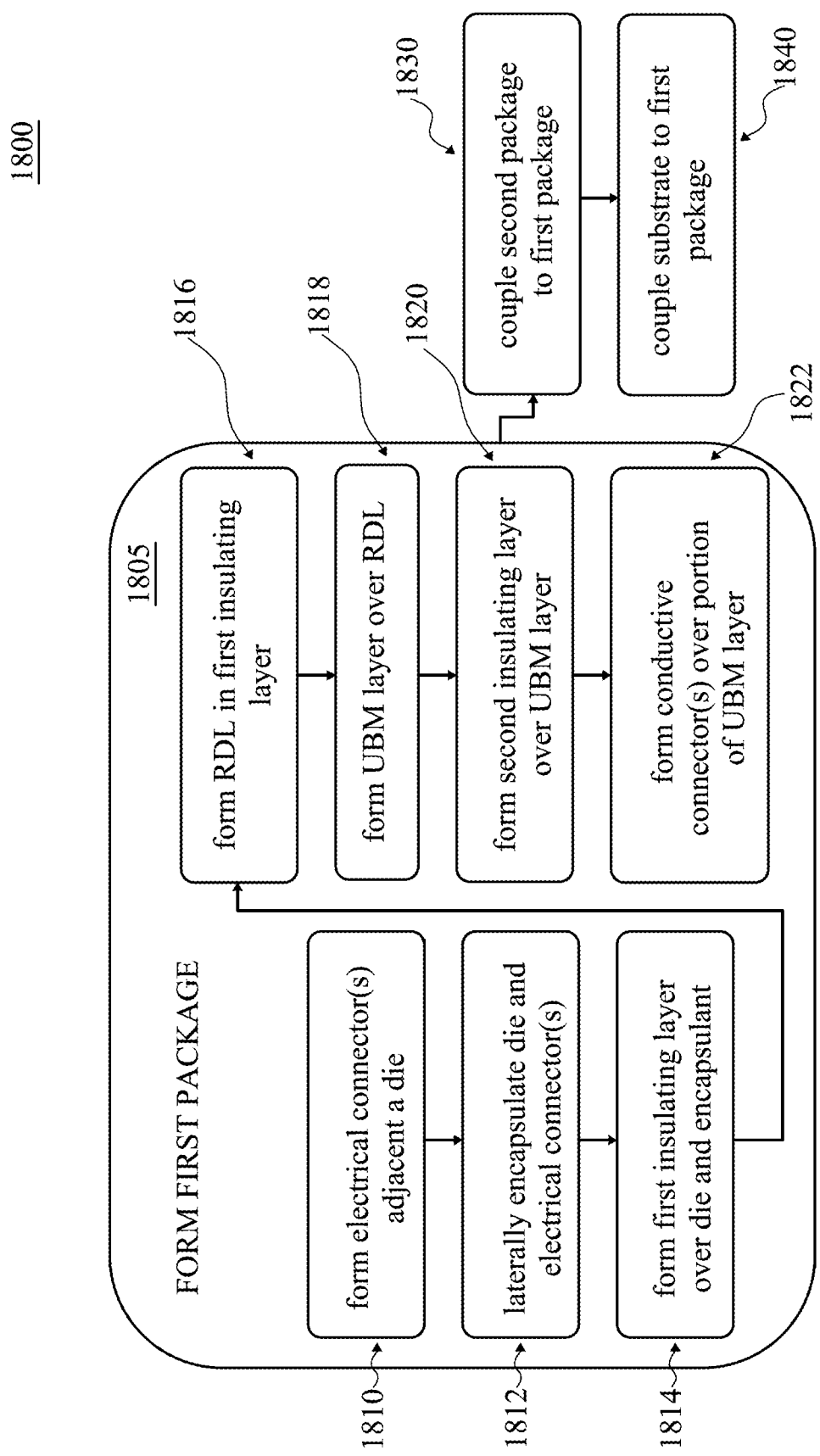
FIGS. 18a and 18b are flowcharts illustrating packaging and UBM/RDL fabrication methods, in accordance with some embodiments.

As generally illustrated in FIG. 18a, a representative method 1800 for forming a PoP structure 1700 begins with a first process 1805 to form a first package. In step 1810, one or more electrical connectors are formed adjacent a die. In step 1812, the die and electrical connector(s) are encapsulated with an encapsulating material (e.g., molding compound). In step 1814, a first insulating layer is formed over the die and electrical connector(s). In step 1816, an RDL is formed in the first insulating layer. In step 1818, a UBM layer is formed over the RDL. In step 1820, a second insulating layer is formed over the UBM layer. In step 1822, one or more conductive connectors are formed over at least a portion of the UBM layer. In a representative embodiment, first process 1805 comprises steps 1810, 1812, 1814, 1816, 1818, 1820, and 1822. Processing may continue with step 1830, where the first package is coupled to a second package. In step 1840, the first package of the combined PoP structure is coupled to a substrate.

Figure 18B:
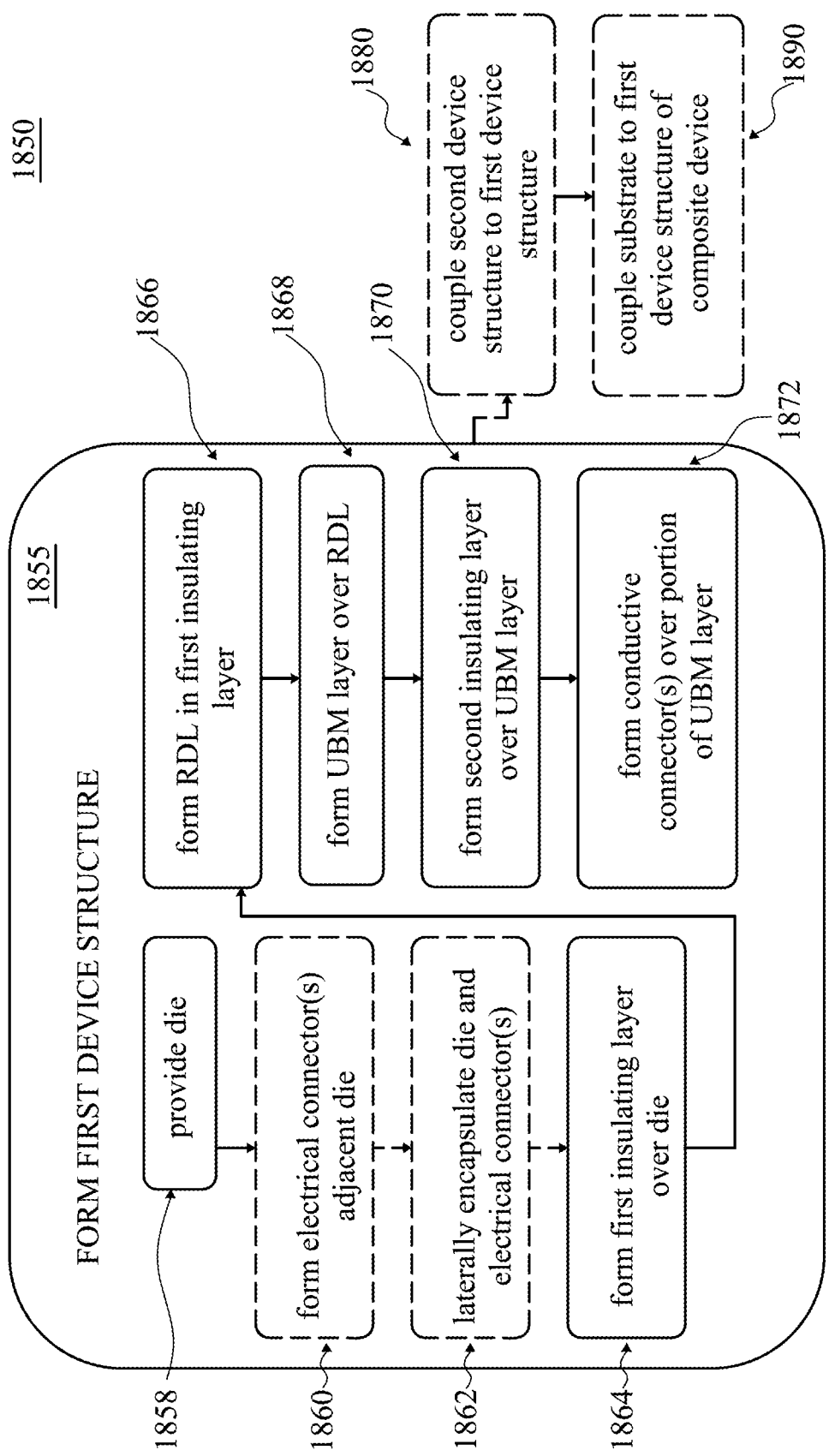

As generally illustrated in FIG. 18b, a representative method 1850 for forming a UBM/RDL routing structure begins with a first process 1855 to form a first device structure. In step 1858, a die is provided. In step 1860, one or more electrical connectors are optionally (as denoted by dashed lines in FIG. 18b) formed adjacent the die. In step 1862, the die and optional electrical connector(s) are optionally encapsulated with an encapsulating material (e.g., molding compound). In step 1864, a first insulating layer is formed over the die. In step 1866, an RDL is formed in the first insulating layer. In step 1868, a UBM layer is formed over the RDL. In step 1870, a second insulating layer is formed over the UBM layer. In step 1872, one or more conductive connectors are formed over at least a portion of the UBM layer. In a representative embodiment, first process 1855 comprises steps 1858, 1864, 1866, 1868, 1870, and 1872. In another representative embodiment, first process 1855 comprises steps 1858, 1864, 1866, 1868, 1870, 1872, and optionally one or both of steps 1860 and 1862. Processing may continue with step 1880, where the first device structure may be optionally coupled to a second device structure. In step 1890, a composite device comprising the coupled second device structure and first device structure may be optionally coupled to a substrate.

Embodiments of representative devices and methods may have several advantages. For example, ball fatigue (normalized to designs employing direct UBM routing) is reduced by a factor of about 67% with utilization of a routing design in accordance with representative embodiments. The predicted package lifespan (normalized to designs employing direct UBM routing) is increased by a factor of about 82% with utilization of a routing design in accordance with representative embodiments. Additionally, the current capacity of an electrical routing design in accordance with representative embodiments for simulated failure at an operating temperature of 110° C. for 10 years (normalized to designs employing direct UBM routing) is improved by a factor of about 300%. Benefits, other advantages, and solutions to problems have been described with regard to specific embodiments; however, benefits, advantages, solutions to problems, and any component(s) that may cause any benefit, advantage, or solution to occur or become more pronounced are not to be construed as a critical, required, or essential feature or component.

In accordance with a representative embodiment, a method includes the steps of: forming a redistribution layer (RDL) over a first side of a first die, the first die having a second side opposite the first side, the RDL comprising a first portion and a second portion, the first portion separated from the second portion by insulating material of the RDL, the first portion and the second portion at a same level in the RDL; forming an under bump metallurgy (UBM) layer over the RDL, the UBM layer comprising a UBM trace and a UBM pad, the UBM trace electrically coupling the first portion to the second portion, the UBM pad electrically coupled to the second portion; and forming a first conductive connector over and electrically coupled to the UBM pad. A first electrical connector is formed adjacent the first die. The RDL and the UBM pad electrically connect the first die to the first conductive connector. The first die and the first electrical connector are at least laterally encapsulated with a molding compound to form a first package. A second package is coupled to the first package using a second set of conductive connectors, the second package being proximate the second side of the first die, the second package comprising a second die. The first portion and the second portion may comprise a same material. The first portion and the second portion may be formed in a same step. An insulating layer may be formed over the UBM layer.

In accordance with another representative embodiment, a method includes forming a first package by: at least laterally encapsulating a first die and a first electrical connector with a molding compound, the first electrical connector adjacent the first die, the first die having a first side and a second side, the second side opposite the first side; forming an insulating layer over the first side of the first die and the molding compound; forming a metallization pattern in the insulating layer; forming an under bump metallurgy (UBM) layer over the metallization pattern; forming an insulating layer over the UBM layer; and forming a first conductive connector over a first portion of the UBM layer, the UBM layer comprising a second portion separated from the first portion by insulating material of the insulating layer, the metallization pattern comprising a third portion that electrically couples the first portion and the second portion, the first portion, the second portion, and the third portion electrically coupled to the first conductive connector, and insulating material of the UBM layer interposed between the third portion and the insulating material, wherein the insulating material is in a different material layer than the insulating material. The metallization pattern and the UBM layer electrically connects the first die to the first conductive connector. The UBM layer may be conformally deposited. The first portion and the second portion may comprise a same material. The first portion and the second portion may comprise a different material than the third portion. The first portion and the second portion may be formed in a same step. The first portion may comprise a UBM pad. A second package may be coupled to the first package using a second set of conductive connectors, the second package being proximate the second side of the first die. A substrate may be coupled to the first package using the first conductive connector, and the second package comprises a second die.

In accordance with another representative embodiment, a package structure has a first package including: a molding compound laterally encapsulating a die and an electrical connector, the electrical connector adjacent the die, the die having a first side and a second side opposite the first side; a redistribution layer (RDL) over the first side of the die and the molding compound; an under bump metallurgy (UBM) layer over the RDL; an insulating layer over the UBM layer; and a first conductive connector over a first portion of the UBM layer; wherein: the UBM layer comprises a second portion separated from the first portion by insulating material of the insulating layer; the RDL comprises a third portion disposed under and electrically coupling the first portion and second portion; the first portion, second portion, and third portion electrically connected to the first conductive connector; insulating material of the UBM layer is interposed between the third portion and the insulating material; and the insulating material is a different material layer than the insulating material. The RDL and the UBM layer electrically connects the die to the first conductive connector. A second package may be coupled to the first package using a second set of conductive connectors, the second package being proximate the second side of the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   disposing a through insulation via (TIV) adjacent a first die over a polymer layer, the polymer layer covering a carrier wafer;
   after disposing the TIV adjacent the first die, encapsulating the TIV and the first die with a molding compound;
   after encapsulating the TIV and the first die, forming a redistribution layer (RDL) over a first side of the first die, the first die having a second side opposite the first side, the RDL comprising a first portion, a second portion, a first section of insulating material, a second section of insulating material, and a third section of insulating material, the first portion of the RDL being separated from the second portion of the RDL by the third section of insulating material of the RDL, the third section of the insulating material extending from the first portion of the RDL to the second portion of the RDL, the first portion of the RDL and the second portion of the RDL being at a same level in the RDL;
   forming an under bump metallurgy (UBM) layer over the RDL, the UBM layer comprising a UBM trace and a UBM pad, a lower portion of the UBM trace being separated from a lower portion of the UBM pad by the second section of insulating material of the RDL, the second section of insulating material of the RDL contacting an uppermost surface of the second portion of the RDL, an uppermost surface of the third section of insulating material being entirely covered by the UBM trace, wherein the uppermost surface of the third section of insulating material extends from a first side of the third section of insulating material to a second side of the third section of insulating material opposite the first side of the third section of insulating material, the third section of insulating material filling an entire area surrounded in a single cross-sectional view of the RDL surrounded by the first portion of the RDL, the second portion of the RDL, the UBM trace, and a straight line extending between a bottommost surface of the first portion of the RDL and a bottommost surface of the second portion of the RDL, the UBM trace of the UBM layer electrically coupling the first portion of the RDL to the second portion of the RDL and the second portion of the RDL electrically coupling the UBM trace to the UBM pad, wherein uppermost surfaces of the first portion of the RDL and the second portion of the RDL are at a first level, and wherein uppermost surfaces of the UBM trace and the UBM pad are at a second level, the second level being above the first level;

after forming the under bump metallurgy (UBM) layer, depositing a passivation layer over the UBM layer, wherein a section of the passivation layer separates an upper portion of the UBM trace from an upper portion of the UBM pad and the second section of insulating material of the RDL separates the passivation layer from the second portion of the RDL;

after depositing the passivation layer, forming a first conductive connector over and electrically coupled to the UBM pad, the first portion of the RDL, the UBM trace, the second portion of the RDL and the UBM pad being electrically connected to the first conductive connector, and wherein the TIV is located directly below the UBM trace and the second portion of the RDL in a vertical direction, wherein the vertical direction is parallel to a longitudinal axis of the TIV, wherein the first conductive connector is the only conductive connector electrically connected to the UBM trace;

sending a test signal in order through the first conductive connector, through the UBM pad, through the second portion of the RDL, through the UBM trace, and to the first portion of the RDL; and removing the carrier wafer and exposing the TIV through the polymer layer.

2. The method of claim 1, wherein the RDL and the UBM pad electrically connect the first die to the first conductive connector.

3. The method of claim 1, further comprising, after the sending the test signal, coupling a second package to the RDL using a second set of conductive connectors, the second package being proximate the second side of the first die, the second package comprising a second die.

4. The method of claim 1, wherein the first portion and the second portion comprise a same material.

5. The method of claim 4, wherein the first portion and the second portion are formed in a same step.

6. The method of claim 1, further comprising forming an insulating layer over the UBM trace.

7. The method of claim 1, wherein the forming the underbump metallurgy layer is conformally deposited.

8. A method comprising:
forming a first package by:
laterally encapsulating a first die and a through insulation via (TIV) with a molding compound, the TIV adjacent the first die, the first die having a first side and a second side, the second side opposite the first side, wherein the laterally encapsulating occurs while the first die and the TIV are located over a polymer layer over a carrier wafer;
after laterally encapsulating the first die and the TIV with the molding compound, forming a first insulating layer over the first side of the first die and the molding compound;
after forming the first insulating layer, forming a metallization pattern at least partially in the first insulating layer;
after the forming the metallization pattern, forming a second insulating layer over the metallization pattern, the second insulating layer comprising a first insulating region and a second insulating region, wherein after the forming the second insulating layer the metallization pattern comprises a first portion and a second portion separated from the first portion by the second insulating region of the second insulating layer;
after forming the metallization pattern, forming an under bump metallurgy (UBM) layer over the metallization pattern, wherein:
the UBM layer comprises a UBM pad;
the first portion and the second portion have top surfaces which are co-planar with each other at a first level; and
the UBM layer comprises a third portion that electrically couples the first portion and the second portion, wherein the third portion is formed covering the second insulating region and is formed with one end in contact with the first portion at the first level and is formed with another end opposite the one end in contact with the second portion at the first level, the third portion and the UBM pad being a different conductive material from conductive material of the first and second portions, and wherein an uppermost surface of the second insulating region extending fully across the second insulating region is entirely covered by the third portion of the UBM layer and the second insulating region filling an entire area in a single cross-sectional view of the metallization pattern, the entire area being surrounded by the third portion of the UBM layer, the first portion of the metallization pattern, the second portion of the metallization pattern, and a straight line extending between a bottommost surface of the first portion of the metallization pattern and a bottommost surface of the second portion of the metallization pattern;
after forming the UBM layer, forming a third insulating layer over the UBM layer; and
after forming the third insulating layer, forming a first conductive connector over the UBM layer, wherein the first portion, the second portion, the third portion, and the UBM pad are electrically coupled to the first conductive connector, and wherein the third portion of the UBM layer is directly above the TIV along a line perpendicular to a top surface of the TIV, wherein the first conductive connector is the only conductive connector electrically connected to the third portion;
removing the carrier wafer after the forming the third insulating layer;
after the removing the carrier wafer, forming an opening through the polymer layer to expose the TIV; and
after forming the first conductive connector, identifying defective package structures by sending an electrical signal from the first conductive connector, through the UBM pad, through the second portion of the metallization pattern, through the third portion of the UBM layer, and to the first portion of the metallization pattern, in this order.

9. The method of claim 8, wherein the metallization pattern and the UBM layer electrically connects the first die to the first conductive connector.

10. The method of claim 8, wherein the UBM layer is conformally deposited.

11. The method of claim 8, wherein the first portion and the second portion comprise a same material.

12. The method of claim 11, wherein the first portion and the second portion comprise a different material than the third portion.

13. The method of claim 8, wherein the first portion and the second portion are formed in a same step.

14. The method of claim 8 further comprising, after the forming the first conductive connector, coupling a second package to the first package using a second set of conductive connectors, the second package being proximate the second side of the first die.

15. The method of claim 14 further comprising, coupling a substrate to the first package using the first conductive connector, and wherein the second package comprises a second die.

16. A method of forming a package structure, the method comprising:
   forming a first package by:
      disposing a through insulation via (TIV) adjacent a die over a polymer layer, the die having a first side and a second side opposite the first side, wherein the polymer layer is located over a carrier wafer during the disposing the TIV;
      after disposing the TIV adjacent the die, laterally encapsulating the die and the TIV with a molding compound;
      after laterally encapsulating the die and the TIV, forming a redistribution layer (RDL) over the first side of the die and the molding compound;
      after forming the RDL, forming a first insulating layer over the RDL, the first insulating layer comprising a first insulating portion and a second insulating portion;
      after forming the first insulating layer, disposing an under bump metallurgy (UBM) layer over the RDL;
      after disposing the UBM layer over the RDL, forming a second insulating layer over the UBM layer, the second insulating layer comprising a third insulating portion and a fourth insulating portion;
      after forming the second insulating layer, disposing a first conductive connector over a first portion of the UBM layer, wherein:
         the UBM layer comprises a second portion separated from the first portion by the third insulating portion of the second insulating layer, wherein the second portion has a top surface facing away from the die, the top surface comprising a first indentation and a second indentation, wherein the fourth insulating portion extends into and fills both the first indentation and the second indentation and also extends to make physical contact with both the first conductive connector and a planar surface of the first portion of the UBM layer, the planar surface also being in physical contact with the first conductive connector, wherein the first conductive connector is the only conductive connector electrically connected to the second portion;
         the first portion comprises a UBM pad of the UBM layer and the second portion comprises a UBM trace of the UBM layer and does not comprise the UBM pad or another UBM pad;
         the RDL comprises a third portion disposed under the UBM layer and electrically coupling the first portion and second portion of the UBM layer and the RDL comprises a fourth portion disposed under the UBM layer, the UBM trace electrically coupling the third portion and fourth portion of the RDL, the first indentation overlying an area of the fourth portion of the RDL layer that is in physical contact with the UBM trace and the second indentation overlying an area of the third portion of the RDL layer that is in physical contact with the second portion of the UBM layer;
         the first portion, second portion, third portion, and fourth portion are electrically connected to the first conductive connector, wherein a first point directly overlies a second point in a first direction, the first direction being parallel with a sidewall of the die, the first point being located within the second portion, and the second point being located on a first surface of the TIV;
         uppermost surfaces of the first portion and the second portion are at a same level as an uppermost surface of the UBM layer;
         an uppermost surface of the second insulating portion being entirely covered by the second portion of the UBM layer and the second insulating portion filling an entire area in a single cross-sectional view surrounded by the second portion of the UBM layer, the third portion of the RDL, the fourth portion of the RDL, and a straight line extending between a bottommost surface of the third portion of the RDL and a bottommost surface of the fourth portion of the RDL; and
      removing the carrier wafer and exposing the TIV through the polymer layer.

17. The method of claim 16, further comprising electrically connecting the die to the first conductive connector through the RDL and the UBM layer.

18. The method of claim 16, further comprising coupling a second package to the first package using a second set of conductive connectors, the second package being proximate the second side of the die.

19. The method of claim 18, further comprising coupling a substrate to the first package using the first conductive connector, wherein the second package comprises a second die.

20. The method of claim 19, wherein the first insulating layer comprises a different material than the second insulating layer.

* * * * *